US012787878B2

(12) United States Patent
Li et al.

(10) Patent No.: US 12,787,878 B2
(45) Date of Patent: Nov. 3, 2026

(54) STACKED INTEGRATED CIRCUIT DEVICES

(71) Applicant: QUALCOMM Incorporated, San Diego, CA (US)

(72) Inventors: Yue Li, San Diego, CA (US); Ryan Lane, San Diego, CA (US); Yangyang Sun, San Diego, CA (US); Charles David Paynter, Encinitas, CA (US); Durodami Lisk, San Diego, CA (US)

(73) Assignee: QUALCOMM INCORPORATED, San Diego, CA (US)

( * ) Notice: Subject to any disclaimer, the term of this patent is extended or adjusted under 35 U.S.C. 154(b) by 451 days.

(21) Appl. No.: 18/451,971

(22) Filed: Aug. 18, 2023

(65) Prior Publication Data

US 2025/0062285 A1 Feb. 20, 2025

(51) Int. Cl.
*H10W 90/00* (2026.01)
*H10W 42/00* (2026.01)
(Continued)

(52) U.S. Cl.
CPC .......... *H10W 90/00* (2026.01); *H10W 70/611* (2026.01); *H10W 70/65* (2026.01);
(Continued)

(58) Field of Classification Search
CPC ... H10W 90/00; H10W 70/65; H10W 90/701; H10W 90/24; H10W 90/726; H10W 90/792; H10W 90/722; H10W 90/724; H10W 72/20; H10W 72/072; H10W 72/9413; H10W 72/241; H10W 74/012;
(Continued)

(56) References Cited

U.S. PATENT DOCUMENTS 7,858,441 B2 * 12/2010 Lin ..................... H01L 25/0657 438/455
9,570,322 B2 * 2/2017 Su ......................... H10W 90/00
(Continued)

OTHER PUBLICATIONS

International Search Report and Written Opinion—PCT/US2024/037877—ISA/EPO—Dec. 2, 2024.
(Continued)

*Primary Examiner* — Sonya McCall-Shepard
(74) *Attorney, Agent, or Firm* — Moore IP

(57) ABSTRACT

A stacked integrated circuit (IC) device includes a first die having a first face, a first active region adjacent to the first face, and first die-interconnect contacts disposed on the first face and connected to first circuitry. The stacked IC device includes a second die having a second face, a second active region adjacent to the second face, and second die-interconnect contacts disposed on the second face and connected to second circuitry. The first face is oriented toward the second face, and the first die-interconnect contacts are connected to the second die-interconnect contacts. The stacked IC device includes a set of redistribution layers electrically connected to redistribution contacts on the first face, the second face, or both. The stacked IC device also includes interconnect conductors connected to the redistribution layers to provide signal paths from the first die, the second die, or both, to a set of external contacts.

30 Claims, 10 Drawing Sheets

(51) Int. Cl.

| | |
|---|---|
| ***H10W 70/09*** | (2026.01) |
| ***H10W 70/60*** | (2026.01) |
| ***H10W 70/65*** | (2026.01) |
| ***H10W 72/00*** | (2026.01) |
| ***H10W 72/20*** | (2026.01) |
| ***H10W 72/90*** | (2026.01) |
| ***H10W 90/20*** | (2026.01) |
| ***H10W 90/22*** | (2026.01) |
| ***H10W 90/24*** | (2026.01) |

(52) U.S. Cl.
CPC .......... *H10W 90/701* (2026.01); *H10W 90/24* (2026.01); *H10W 90/726* (2026.01); *H10W 90/792* (2026.01)

(58) Field of Classification Search
CPC . H10W 74/141; H10W 74/15; H10W 90/721; H10W 90/728; H10W 90/7295; H10W 90/731; H10W 90/732; H10W 90/734; H10W 90/738; H10W 70/60–635; H10W 20/427; H10W 70/09; H10W 70/614; H10W 70/685; H10W 74/117; H10W 70/099; H10W 72/01; H10W 72/07254; H10W 72/247; H10W 72/823; H10W 72/874; H10W 90/288; H10W 90/291; H10W 90/297; H10W 20/20; H10W 70/656; H10W 90/22; H10W 42/121; H10W 90/271; H01L 24/17; H01L 24/81; H01L 2224/04105; H01L 2224/16145; H01L 2224/16227; H01L 2924/15311; H01L 24/19; H01L 2225/06548; H01L 2225/06562; H01L 25/0657; H01L 25/043; H01L 25/0652; H10B 80/00
See application file for complete search history.

(56) References Cited

U.S. PATENT DOCUMENTS

| | | | | |
|---|---|---|---|---|
| 2014/0225248 | A1* | 8/2014 | Henderson .......... | H10W 20/427 438/122 |
| 2015/0279806 | A1* | 10/2015 | Wu ..................... | H10W 70/095 257/737 |
| 2020/0043853 | A1* | 2/2020 | Kim .................... | H01L 23/5385 |
| 2021/0020605 | A1 | 1/2021 | Hiner et al. | |
| 2021/0098421 | A1* | 4/2021 | Wu ....................... | H01L 23/295 |
| 2022/0278084 | A1* | 9/2022 | Ong .................... | H01L 23/5385 |
| 2022/0415815 | A1* | 12/2022 | Waidhas ............. | H10W 70/614 |

OTHER PUBLICATIONS

Partial International Search Report—PCT/US2024/037877—ISA/EPO—Oct. 10, 2024.

* cited by examiner

STACKED INTEGRATED CIRCUIT DEVICES

FIELD

Various features relate to stacked integrated circuit devices.

BACKGROUND

Electrical connections exist at each level of a system hierarchy. This system hierarchy includes interconnection of active devices at a lowest system level all the way up to system level interconnections at the highest level. For example, interconnect layers can connect different devices together on an integrated circuit. As integrated circuits become more complex, more interconnect layers are used to provide the electrical connections between the devices. More recently, the number of interconnect levels for circuitry has substantially increased due to the large number of devices that are now interconnected in a modern electronic device. The increased number of interconnect levels for supporting the increased number of devices involves more intricate manufacturing processes.

During the design of modern integrated circuit devices, there is often a conflict between various design goals. For example, in some applications, it is desirable to limit integrated circuit package size, and it is desirable to improve heat dissipation. However, generally, smaller integrated circuit packages have less area for removal of heat. Thus, reducing package size can tend to reduce heat dissipation. Similar conflicts can arise between heat dissipation and processing performance because higher performance processors tend to generate more heat. Further, the goal of reducing cost can conflict with almost any other improvement goal. Thus, it is challenging to provide high performance integrated circuit devices that can meet the various design goals. These challenges are especially significant for mobile applications where power constraints, device size, processing performance, heat dissipation, cost, and many other factors come into play simultaneously.

SUMMARY

Various features relate to integrated circuit (IC) devices.

One example provides a stacked IC device that includes a first die having a first face, a first active region adjacent to the first face, first circuitry disposed in the first active region, and first die-interconnect contacts disposed on the first face and electrically connected to the first circuitry. The stacked IC device also includes a second die having a second face, a second active region adjacent to the second face, second circuitry disposed in the second active region, and second die-interconnect contacts disposed on the second face and electrically connected to the second circuitry. The first face is oriented toward the second face, and the first die-interconnect contacts are electrically connected to the second die-interconnect contacts. The stacked IC device includes a set of redistribution layers electrically connected to redistribution contacts on the first face, the second face, or both. The stacked IC device also includes interconnect conductors external to the first die and external to the second die and electrically connected to the redistribution layers to provide signal paths from the first die, the second die, or both, to a set of external contacts.

Another example provides a device that includes a stacked IC device on a first side of a substrate, where the substrate has a set of external contacts on a second side. The stacked IC device includes a first die having a first face, a first active region adjacent to the first face, first circuitry disposed in the first active region, and first die-interconnect contacts disposed on the first face and electrically connected to the first circuitry. The stacked IC device includes a second die having a second face, a second active region adjacent to the second face, second circuitry disposed in the second active region, and second die-interconnect contacts disposed on the second face and electrically connected to the second circuitry. The first face is oriented toward the second face, and the first die-interconnect contacts are electrically connected to the second die-interconnect contacts. The stacked IC device includes a set of redistribution layers electrically connected to redistribution contacts on the first face, the second face, or both. The stacked IC device includes interconnect conductors external to the first die and external to the second die and electrically connected to the redistribution layers to provide signal paths from the first die, the second die, or both, to the set of external contacts.

Another example provides a method for fabricating a stacked IC device. The method includes electrically connecting a first die face-to-face with a second die using first die-interconnect contacts disposed on a first face of the first die and second die-interconnect contacts disposed on a second face of the second die, where a face of a die corresponds to a surface of the die bounding an active region of the die, the active region including circuitry. The method includes forming a set of redistribution layers electrically connected to redistribution contacts on the first face, the second face, or both. The method includes forming interconnect conductors external to the first die and external to the second die and electrically connected to the redistribution layers to provide signal paths from the first die, the second die, or both, to a set of external contacts.

BRIEF DESCRIPTION OF THE DRAWINGS

Various features, nature and advantages may become apparent from the detailed description set forth below when taken in conjunction with the drawings in which like reference characters identify correspondingly throughout.

DETAILED DESCRIPTION

Figure 1:
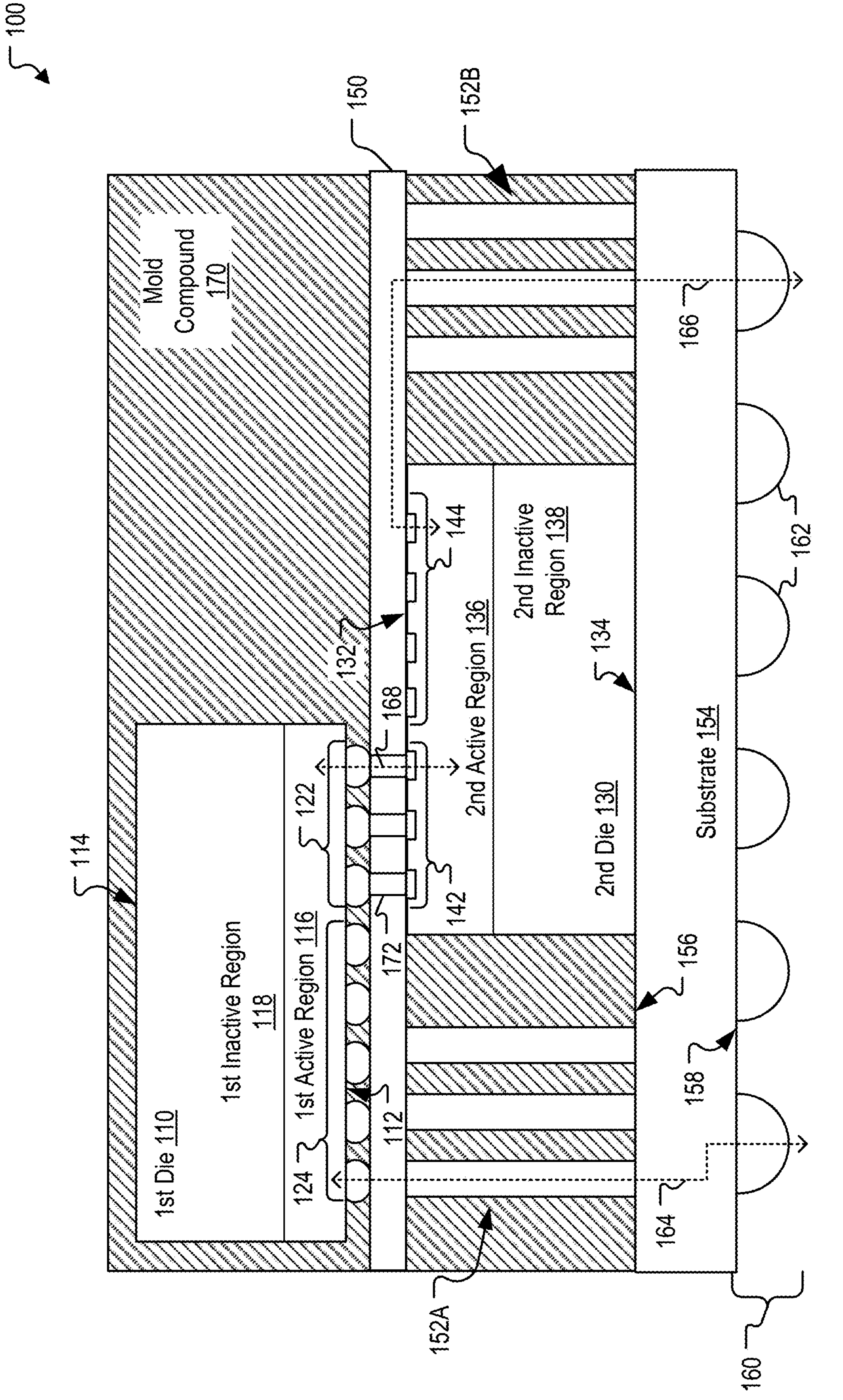
FIG. 1 illustrates a schematic cross-sectional view of an example of an exemplary stacked IC device.

Particular aspects of the disclosure describe integrated circuit (IC) devices and methods of fabrication that use a face-to-face stacked die configuration to achieve various IC design goals. In this context, a "face" of a die refers to the surface of the die adjacent to an active region of the die that includes active circuitry. For example, the active region can include various layers and structures that define circuit elements, such as transistors, conductors, passive circuit elements (e.g., resistors, inductors, capacitors, etc.). In this example, the face of the die corresponds to the side of the die that bounds this active region. In contrast, a "back" of the die refers to an opposite side of the die which bounds an inactive region of the die. For example, the inactive region typically includes undoped monocrystalline semiconductive material and other inactive layers (e.g., passivation layers).

Stacking dies face-to-face enables the use of short, high-density (e.g., small pitch) interconnections between the dies. Shorter interconnections are generally subject to less resistive loss, resulting in improved power efficiency and less heat generation. Additionally, shorter interconnections enable faster signal exchange than longer interconnections. Further, high-density interconnections between the dies results in smaller IC package size and/or an increase in area available for heat exchange.

In particular implementations described herein, two or more dies are stacked face-to-face, and circuitry of the two or more dies is electrically interconnected via die-interconnect conductors. External connections to either or both of the dies are provided via external contacts of a package substrate (e.g., an array of solder balls). For example, the external contacts can be electrically connected to one or more of the stacked dies via interconnect conductors (e.g., through-mold vias or vias of an interposer device) and a set of redistribution layers. In this arrangement, the stacked dies can be devoid of through silicon vias, which simplifies fabrication of the dies. Avoiding the use of through silicon vias for die-to-die signaling also uses the footprint area of each die more efficiently since no areas of the die are dedicated to accommodating through silicon vias.

In various implementations, the face-to-face stacked die arrangement disclosed herein is a low cost and technically achievable way to provide a packaged IC with a small form factor while also achieving other technical benefits, such as improved die interconnect density, simplified die fabrication, improved thermal management, improved power distribution network performance, etc. For example, electrically connecting the faces of the dies enables use of small, densely packed die-interconnect contacts and conductors therebetween. For example, microbumps or similar technology can be used to interconnect the dies, providing short, high-density interconnection between the dies. As another example, electrically connecting the dies to external contacts through a set of redistribution layers coupled to the faces of the dies avoids the need for through-silicon vias in one or more of the dies, which reduces die fabrication cost, enables more efficient use of die footprint area, improves die yield, and simplifies die design. As yet another example, when the dies are stacked face-to-face in an offset arrangement, heat generating portions of the dies can be offset from one another, providing improved thermal management. Further, in this example, devices that provide additional benefits can be disposed in offset regions adjacent to the dies. To illustrate, a device that includes one or more capacitors can be disposed in such an offset region and electrically connected to a power distribution network of a die of the die stack, which provides a short signal path between the power distribution network and the capacitor(s), which improves the performance of the power distribution network. The face-to-face stacked die arrangements disclosed herein can also enable shorter signal paths between one or more dies and one or more other devices, such as between a processing die and a memory device, thereby improving performance of the packaged IC device.

In the following description, specific details are given to provide a thorough understanding of the various aspects of the disclosure. However, it will be understood by one of ordinary skill in the art that the aspects may be practiced without these specific details. For example, circuits may be shown in block diagrams in order to avoid obscuring the aspects in unnecessary detail. In other instances, well-known circuits, structures and techniques may not be shown in detail in order not to obscure the aspects of the disclosure.

Particular aspects of the present disclosure are described below with reference to the drawings. In the description, common features are designated by common reference numbers. As used herein, various terminology is used for the purpose of describing particular implementations only and is not intended to be limiting of implementations. For example, the singular forms "a," "an," and "the" are intended to include the plural forms as well, unless the context clearly indicates otherwise. Further, some features described herein are singular in some implementations and plural in other implementations. For ease of reference herein, such features are generally introduced as "one or more" features and are subsequently referred to in the singular or optional plural (as indicated by "(s)") unless aspects related to multiple of the features are being described.

As used herein, the terms "comprise," "comprises," and "comprising" may be used interchangeably with "include." "includes," or "including." As used herein, "exemplary" indicates an example, an implementation, and/or an aspect, and should not be construed as limiting or as indicating a preference or a preferred implementation. As used herein, an ordinal term (e.g., "first," "second," "third," etc.) used to modify an element, such as a structure, a component, an operation, etc., does not by itself indicate any priority or order of the element with respect to another element, but rather merely distinguishes the element from another element having a same name (but for use of the ordinal term). As used herein, the term "set" refers to one or more of a particular element, and the term "plurality" refers to multiple (e.g., two or more) of a particular element.

Improvements in manufacturing technology and demand for lower cost and more capable electronic devices has led to increasing complexity of ICs. Often, more complex ICs have more complex interconnection schemes to enable interaction between ICs of a device. The number of interconnect levels for circuitry has substantially increased due to the large number of devices that are now interconnected in a state-of-the-art mobile application device.

These interconnections include back-end-of-line (BEOL) interconnect layers, which may refer to the conductive interconnect layers for electrically coupling to front-end-of-line (FEOL) active devices of an IC. The various BEOL interconnect layers are formed at corresponding BEOL interconnect levels, in which lower BEOL interconnect levels generally use thinner metal layers relative to upper BEOL interconnect levels. The BEOL interconnect layers may electrically couple to middle-of-line (MOL) interconnect layers, which interconnect to the FEOL active devices of an IC.

State-of-the-art mobile application devices demand a small form factor, low cost, a tight power budget, and high electrical performance. Mobile package design has evolved to meet these divergent goals for enabling mobile applications that support multimedia enhancements. For example, fan-out (FO) wafer level packaging (WLP) or FO-WLP process technology is a development in packaging technology that is useful for mobile applications. This chip first FO-WLP process technology solution provides flexibility to fan-in and fan-out connections from a die to package balls. In addition, this solution also provides a height reduction of a first level interconnect between the die and the package balls of mobile application devices. These mobile applications, however, are susceptible to power and signal routing issues when multiple dies are arranged within the small form factor.

Stacked die schemes and chiplet architectures are becoming more common as significant power performance area (PPA) yield enhancements are demonstrated for stacked die and chiplet architecture product lines. As used herein, "stacked dies" and/or "stacked ICs" refer to arrangements in which one die (e.g., a first die) is disposed over (including directly over) another die (e.g., a second die). In a stacked die or stacked IC device, the one or more of the dies can also be positioned over one or more other devices, such as an integrated capacitor device, as described further below. Unfortunately, stacked die schemes can involve high power density targets, which impose significant power distribution inefficiencies. Various aspects of the present disclosure provide a stacked IC device arranged to provide improved integration of a capacitor with a power distribution network (PDN), resulting in improved PDN performance.

As used herein, the term "layer" includes a film, and is not construed as indicating a vertical or horizontal thickness unless otherwise stated. As used herein, the term "chiplet" may refer to an integrated circuit block, a functional circuit block, or other like circuit block specifically designed to work with one or more other chiplets to form a larger, more complex chiplet architecture.

A 3D integrated circuit (3D IC) includes a set of stacked and interconnected dies. Generally, a 3D IC architecture can achieve higher performance, increased functionality, lower power consumption, and/or smaller footprint, as compared to providing the same circuitry in a monolithic die or in a two-dimensional (2D) IC structure. Unfortunately, capacitive decoupling for power distribution networks (PDNs) of 3D ICs to suppress power distribution noise is challenging. In particular, the available space for landside capacitors (LSCs) under a die shadow in a 3D IC is limited due to the smaller footprint of 3D ICs. For example, different logic blocks of a 3D IC may be placed to overlap each other in the stacked dies, making it even more challenging to provide decoupling for the circuitry in the stacked dies. In addition, an electrical path of the traditional landside capacitor placement on a package substrate may exhibit larger inductance parasitics, which may degrade the landside capacitor decoupling performance.

Exemplary Stacked IC Device

FIG. 1 illustrates a schematic cross-sectional view of an example of an exemplary stacked IC device 100. The stacked IC device 100 includes a plurality of dies (e.g., a first die 110 and a second die 130). As explained further below, the first and second dies 110, 130 are stacked face-to-face to form the stacked IC device 100. The dies 110, 130 are disposed on a first side 156 of a substrate 154, and a set of external contacts 162 (such as a ball grid array 160) are disposed on a second side 158 of the substrate 154.

The first die 110 includes a first active region 116 adjacent to a first face 112 of the first die 110 and a first inactive region 118 adjacent to a back 114 of the first die 110. The first active region 116 includes first circuitry, such as conductors, passive components, transistors, etc. For example, the first circuitry can include conductors arranged to form a power distribution network (PDN) and a plurality of transistors and/or other circuit elements arranged and interconnected to form logic cells, memory cells, etc. In the first active region 116, the components of the first circuitry can be formed in and/or over a semiconductor substrate by formation of various insulating layers, conductive layers, and doped/undoped regions. Different implementations can use different types of transistors, such as a field effect transistor (FET), planar FET, finFET, a gate all around FET, or mixtures of transistor types. In some implementations, a front end of line (FEOL) process may be used to fabricate the first circuitry in and/or over the semiconductor substrate. In contrast, the first inactive region 118 can include, for example, an undoped semiconductor material, oxide or passivation layers, or another material that does not include circuit elements. To illustrate, in some implementations, the first inactive region 118 is devoid of conductors, devoid of vias, devoid of contacts, or devoid of each of these.

The second die 130 includes a second active region 136 adjacent to a second face 132 of the second die 130 and a second inactive region 138 adjacent to a back 134 of the second die 130. The second active region 136 includes second circuitry, such as conductors, passive components, transistors, etc. For example, the second circuitry can include conductors arranged to form a PDN and a plurality of transistors and/or other circuit elements arranged and interconnected to form logic cells, memory cells, etc. In the second active region 136, the components of the second circuitry can be formed in and/or over a semiconductor substrate by formation of various insulating layers, conductive layers, and doped/undoped regions. Similar to the first inactive region 118, the second inactive region 138 can include, for example, an undoped semiconductor material, oxide or passivation layers, or another material that does not include circuit elements. To illustrate, in some implementations, the second inactive region 138 is devoid of conductors, devoid of vias, devoid of contacts, or devoid of each of these.

The first circuitry of the first die 110 and the second circuitry of the second die 130 are configured to cooperate to perform various operations. For example, in some implementations, the first circuitry includes one or more first functional circuit blocks and the second circuitry includes one or more second functional circuit blocks, and the first and second functional circuit block(s) are operationally dependent upon one another. In some such implementations, the first die is a first chiplet and the second die is a second chiplet designed to operate in conjunction with the first chiplet. In other examples, one of the dies 110, 130 includes circuitry arranged to form logic blocks and the other of the dies 110, 130 includes circuitry arranged to form functional blocks to support the logic blocks, such as memory cells, additional logic blocks, etc. In one illustrative example, the first circuitry of the first die 110 includes functional blocks arranged to operate as one or more cores of a central processing unit (CPU) (e.g., configured to perform general processing tasks using sequential instructions), and the second circuitry of the second die 110 includes functional blocks arranged to operate as one or more cores of a graphics processing unit (GPU) (e.g., configured to perform high-throughput parallel processing tasks).

The first face 112 of the first die 110 includes a set of electrical contacts connected to the first circuitry, and the second face 132 of the second die 130 includes a set of electrical contacts connected to the second circuitry. In FIG. 1, the contacts on the first face 112 of the first die 110 include first die-interconnect contacts 122 and first redistribution contacts 124. Similarly, the contacts on the second face 132 of the second die 130 include second die-interconnect contacts 142 and second redistribution contacts 144. In this context, "die-interconnect contacts" include contacts to support electrical connections between the dies 110, 130, and "redistribution contacts" include contacts to support electrical connections between the die 110, the die 130, or both, and other devices of the stacked IC device 100 or external to the stacked IC device 100.

In the stacked IC device 100, the first die-interconnect contacts 122 are electrically connected to the second die-interconnect contacts 142 to provide a set of conductive paths (such as exemplary signal path 168) between the first circuitry and the second circuitry. For example, one or more first transistors of the first circuitry can be connected to one or more second transistors of the second circuitry through the first die-interconnect contacts 122 and the second die-interconnect contacts 142. As another example, a PDN of the first circuitry can be connected to a PDN of the second circuitry through the first die-interconnect contacts 122 and the second die-interconnect contacts 142.

In a particular aspect, a set of redistribution layers 150 is electrically connected to the first redistribution contacts 124 on the first face 112, to the second redistribution contacts 144 on the second face 132, or both. Further, interconnect conductors 152 external to the first die 110 and external to the second die 130 are electrically connected to the redistribution layers 150 to provide signal paths from the first die 110, the second die 130, or both, to the external contacts 162. For example, in FIG. 1, first interconnect conductors 152A provide conductive signal paths 164 between the first redistribution contacts 124 and the external contacts 162, and second interconnect conductors 152B provide conductive signal paths 166 between the second redistribution contacts 144 and the external contacts 162. The signal paths 164, 166 are configured to provide power connections, external input/output (IO) connections, or both. In the example illustrated in FIG. 1, the interconnect conductors 152 include through-mold vias (TMVs) that extend through a mold compound 170 that at least partially encapsulates the first die 110 and the second die 130. In other examples, the interconnect conductors 152 can include conductive vias formed in other materials, such as through silicon vias or through glass vias formed in an interposer device (e.g., a third die).

Stacking the dies 110, 130 face-to-face as illustrated in FIG. 1 enables the use of short, high-density (e.g., small pitch) interconnections 172 between the dies 110, 130. The interconnections 172 provide short signal paths 168, which (as compared to longer signal paths, such as signal paths 164, 166 or typical redistribution connections) are generally subject to lower resistive losses (resulting in improved power efficiency and better heat management), enable faster signal exchange, and enable higher connection density (enabling use of smaller dies 110, 130 and/or smaller stacked IC devices 100, increased heat exchange area, or both). Further, offsetting the dies 110, 130 such that an overlap region of the faces 112, 132 of the dies 110, 130 includes the die-interconnect contacts 122, 142 and non-overlapping regions of the faces 112, 132 include the redistribution contacts 124, 144 enables routing of power and IO connections to the external contacts 162 without the use of vias (e.g., through silicon vias) in the dies 110, 130 themselves. For example, the interconnect conductors 152 can be disposed adjacent to the second die 130 in the stacked IC device 100 and electrically connected, through the redistribution layers 150, to the redistribution contacts 124, the redistribution contacts 144, or both, of the dies 110, 130. Avoiding the use of through vias in the dies 110, 130 improves die yield, reduces manufacturing cost of the dies 110, 130, enables the use of smaller dies and/or uses die footprint area more efficiently.

The diagram illustrated in FIG. 1 is merely schematic, and is intended to highlight particular features of the stacked IC device 100. For example, the specific number of contacts and interconnections is merely illustrative, and not limiting. In general, each die 110, 130 will include many tens or hundreds of contacts. Likewise, a typical stacked IC device 100 will include tens or hundreds of external contacts 162 and tens or hundreds of interconnect conductors 152. Further, certain internal structures have been omitted from FIG. 1. For example, the redistribution layers 150 include internal conductive traces and vias that are interconnected to form conductive paths. Similarly, the substrate 154 generally also includes internal conductive traces and vias that are interconnected to form conductive paths to the external contacts 162. The substrate 154 can also include other internal features (e.g., embedded cores, embedded passive devices, etc.), other external features (e.g., landside passive devices), or both. Further, in FIG. 1, interconnections between the dies 110, 130 (e.g., to form the signal path 168) and interconnections between the dies 110, 130 and the redistribution layers 150 are illustrated as formed using solder bumps merely to highlight where components of electric connections are generally positioned. In other implementations, the interconnections between the dies 110, 130, the interconnections between the dies 110, 130 and the redistribution layers 150, or both, are formed using other techniques (in addition to or instead of solder bumps), such as copper pillars or pad-to-pad bonding.

As noted above, in some implementations, the dies 110, 130 include chiplets. For example, in some implementations, the first die 110 is a first chiplet and the second die 130 is a second chiplet designed to operate in conjunction with the first chiplet. To illustrate, in some implementations, the circuitry of the first chiplet/first die 110 includes one or more first functional circuit blocks and the circuitry of the second chiplet/second die 130 includes one or more second functional circuit blocks, where the one or more first functional circuit blocks and the one or more second functional circuit blocks are operationally dependent upon one another.

Forming the stacked IC device 100 using chiplets arranged and interconnected as a 3D stacked IC can provide various benefits as compared to providing the same functional circuitry in one monolithic chip. For example, each chiplet is smaller than a single monolithic die including all of the same functional circuit blocks would be. Since yield loss (and costs due to yield lost) in IC manufacturing tends to increase as the die size increases, using smaller dies can reduce yield loss (i.e., increase yield) of the IC manufacturing process. Another benefit is that the chiplets can be fabricated in different locations and/or by different manufacturers, and in some cases, using different fabrication technologies (e.g., different fabrication technology nodes).

As an example, one die of a chiplet-based integrated device (e.g., the first die 110 of the stacked IC device 100) can include components (e.g., interconnects, transistors, etc.) that have a first minimum size, and another die of the chiplet-based integrated device (e.g., the second die 130 of the stacked IC device 100) can include components (e.g., interconnects, transistors, etc.) that have a second minimum size, where the second minimum size is greater than the first minimum size. In contrast, all of the circuitry of a monolithic die is fabricated using the same fabrication technologies and equipment. As a result, when manufacturing a monolithic die, the entire die may be subject to the tightest manufacturing constraint of the most complex component of the monolithic die. In contrast, when using chiplets, different chiplets can be manufactured using different fabrication technologies (e.g., different fabrication technology nodes), and only the chiplet or chiplets that include the most complex components are subjected to the tightest manufacturing constraints. In this arrangement, chiplets fabricated using less expensive and/or higher yield fabrication technologies can be integrated with chiplets fabricated using more expensive and/or lower yield fabrication technologies to form an IC (e.g., the stacked IC device 100), resulting in overall savings. Still further, in some cases, as technology improves, the design of a chiplet can be changed. Chiplet stacking allows such new chiplet designs to be integrated with older chiplet designs to form stacked IC devices, which improves manufacturing flexibility and reduces design costs.

Figure 2:
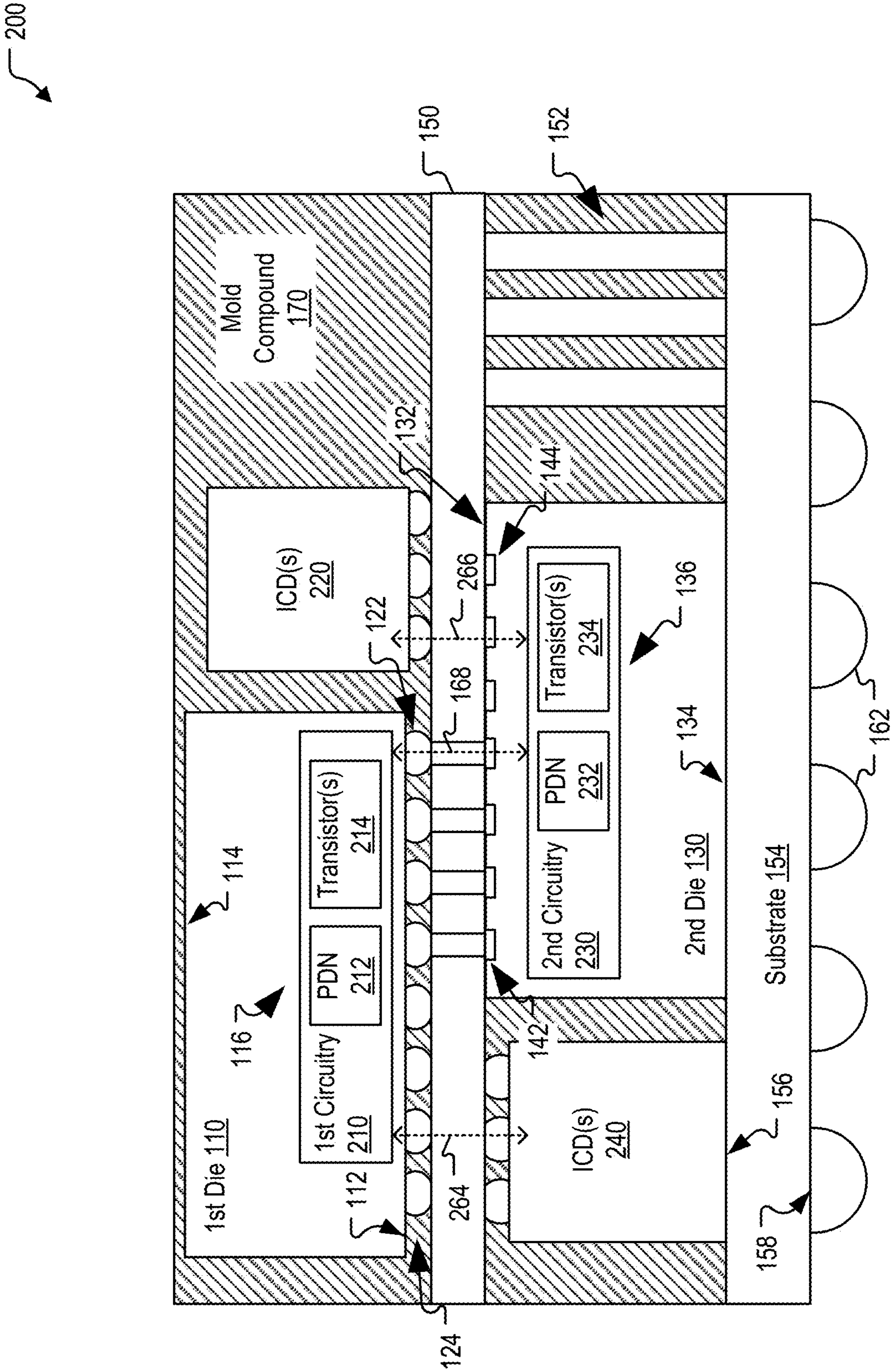
FIG. 2 illustrates a schematic cross-sectional view of another example of the exemplary stacked IC device of FIG. 1.

FIG. 2 illustrates a schematic cross-sectional view of an example of an exemplary stacked IC device 200. The stacked IC device 200 of FIG. 2 is one example of the stacked IC device 100 of FIG. 1. As such, the stacked IC device 200 of FIG. 2 includes each of the components and features of the stacked IC device 100 of FIG. 1. Certain of such components and features are shown in or not called out in FIG. 2 in order to highlight other components and features. Where components and features of the stacked IC device 100 of FIG. 1 are called out in FIG. 2, the same reference numbers used in FIG. 1 are used.

In FIG. 2, the first active region 116 includes first circuitry 210, such as a PDN 212 and a set of transistors 214 arranged to form functional circuitry that is powered by the PDN 212. Similarly, the second active region 136 includes second circuitry 230, such as a PDN 232 and a set of transistors 234 arranged to form functional circuitry that is powered by the PDN 232. The PDNs 212, 232 include, for example, one or more power rails, one or more ground rails, etc. The transistor(s) 214, 234 are arranged and interconnected to form active circuitry that includes, for example, processing logic blocks (e.g., transistor blocks), memory blocks, etc.

In some implementations, the PDN 212 of the first die 110 is electrically connected to the PDN 232 through the first die-interconnect contacts 122 and the second die-interconnect contacts 142. For example, the signal path 168 can connect a ground rail of the PDN 212 to a ground rail of the PDN 232. As another example, the signal path 168 can connect a power rail of the PDN 212 to a power rail of the PDN 232. In the same or different implementations, the PDN 212 of the first die 110, the PDN 232 of the second die 130, or both, are electrically connected, via the redistribution layers 150 and the interconnect conductors 152 to the external contacts 162 (e.g., to provide a power and a ground path to the stacked IC device 200).

In the example illustrated in FIG. 2, the stacked IC device 200 includes one or more other devices disposed adjacent to one or both of the dies 110, 130. For example, in FIG. 2, the stacked IC device 200 includes one or more integrated capacitive devices (ICDs) 220 disposed adjacent to the first die 110 (e.g., on the redistribution layers 150). As another example, in FIG. 2, the stacked IC device 200 includes one or more ICDs 240 disposed adjacent to the second die 110 (e.g., between the first die 110 and the substrate 154). Although FIG. 2 illustrates ICD(s) 220, 240 disposed adjacent to the dies 110, 130, in other implementations, the stacked IC device 200 includes other components (e.g., additional devices) instead of, or in addition to, the ICD(s) 220, 240 disposed adjacent to one or both of the dies 110, 130.

The ICD(s) 220, 240 include one or more capacitors formed on or embedded within a substrate. For example, in some implementations, the capacitor(s) include one or more trench capacitors (e.g., deep trench capacitors (DTCs)) in a semiconductor substrate. As another example, the capacitor(s) include or correspond to one or more multilayer ceramic capacitors. In implementations in which the stacked IC device 200 includes an ICD (e.g., one or more of the ICD(s) 220, 240), the ICD can be electrically connected to one or both of PDNs 212, 232 to suppress power distribution noise of the PDN. In conventional implementations, a PDN can be coupled to one or more landside capacitors disposed on the second side 158 of the substrate 154, to one or more embedded capacitors within the substrate 154, or both, to provide power distribution noise suppression. While one benefit of using stacked IC devices (such as the stacked IC device 200) is reduced footprint of such devices as compared to comparable monolithic IC devices, this reduced footprint can give rise to challenges with positioning of noise suppression capacitors. For example, noise suppression capacitors should be positioned as close to a PDN as possible to provide a low inductance electrical connection between the noise suppression capacitors and the PDN. Higher inductance leads to inefficient use of capacitors leading to degraded PDN performance, and thus, lower inductance electrical connections are generally preferred, especially in low-power devices (e.g., mobile communication devices or other battery powered devices). However, disposing ICD(s) adjacent to the dies 110, 130 of the stacked IC device 200 enable use of short, low inductance electrical connections between the capacitors of the ICD(s) and one or both of the PDNs 212, 232. For example, capacitor(s) of the ICD(s) 240 can be connected via a signal path 264 to the PDN 212 of the first die 110, capacitor(s) of the ICD(s) 220 can be connected via a signal path 266 to the PDN 232 of the second die 130, or both, providing improved PDN performance.

In some implementations, the transistor(s) 214 of the first die 110 are electrically connected to the transistor(s) 234 of the second die 130 through the first die-interconnect contacts 122 and the second die-interconnect contacts 142. For example, the signal path 168 can connect one or more of the transistor(s) 214 and one or more of the transistor(s) 234.

The diagram illustrated in FIG. 2 is merely schematic, and is intended to highlight particular features of the stacked IC device 200. For example, the specific number of contacts and interconnections is merely illustrative, and not limiting. Further, certain internal structures have been omitted from FIG. 2. For example, the redistribution layers 150 and the substrate 154 include internal conductive traces and vias that are interconnected to form conductive paths. Further, in FIG. 2, interconnections between the dies 110, 130 (e.g., to form the signal path 168), interconnections between the dies 110, 130 and the redistribution layers 150, and interconnections to the ICDs 220, 240 are illustrated as formed using solder bumps merely to highlight where separate components of an electric connection are positioned. In other implementations, other interconnection techniques are used.

Figure 3:
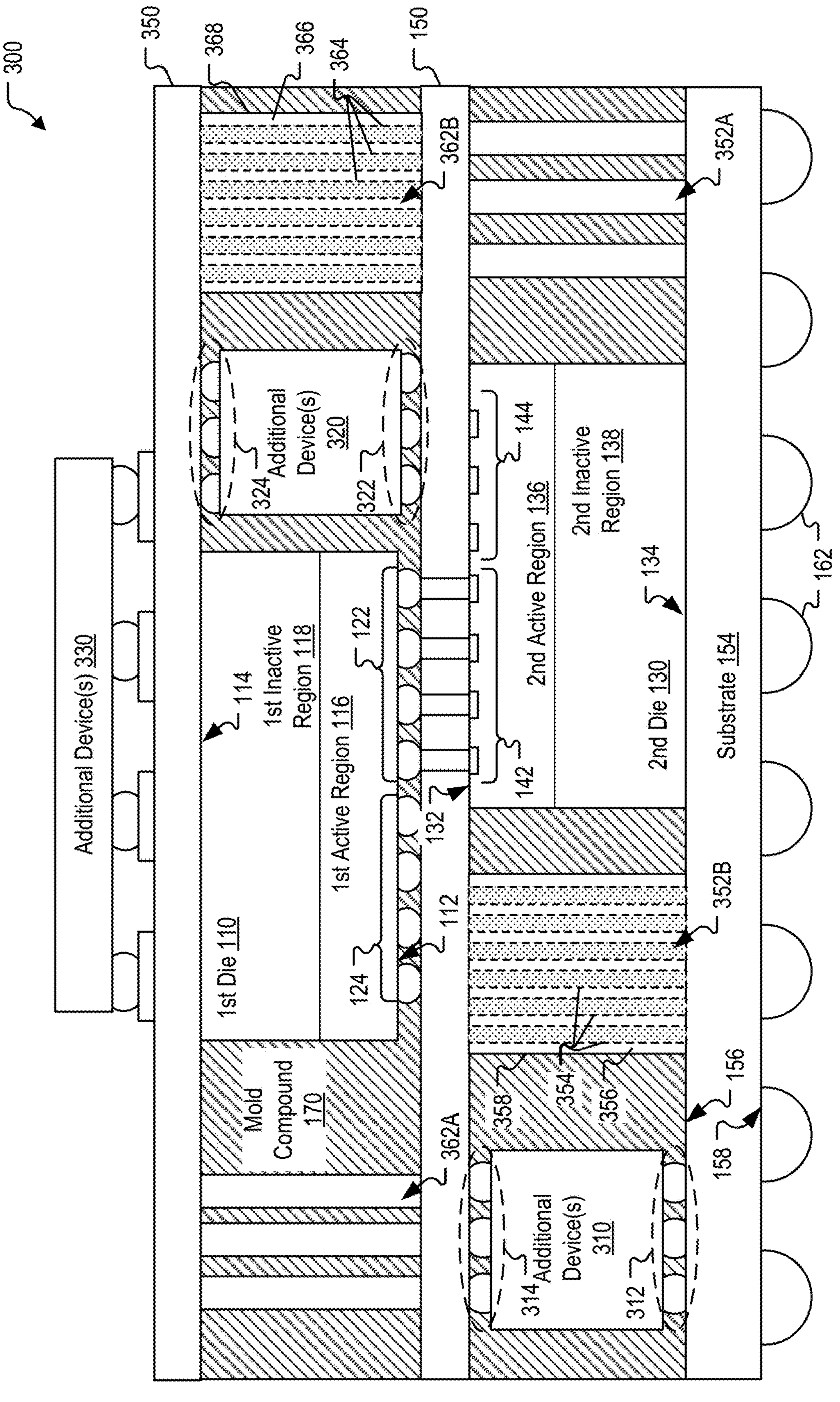
FIG. 3 illustrates a schematic cross-sectional view of another example of the exemplary stacked IC device of FIG. 1.

FIG. 3 illustrates a schematic cross-sectional view of an example of an exemplary stacked IC device 300. The stacked IC device 300 of FIG. 3 is an example of the stacked IC device 100 of FIG. 1 and/or an example of the stacked IC device 200 of FIG. 2. The stacked IC device 300 of FIG. 3 includes each of the components and features of the stacked IC device 100 of FIG. 1. Certain of such components and features are not shown in or not called out in FIG. 3 in order to highlight other components and features. Where components and features of the stacked IC device 100 of FIG. 1 are called out in FIG. 3, the same reference numbers used in FIG. 1 are used.

In FIG. 3, the stacked IC device 300 includes the first die 110, the second die 130, and one or more additional devices. For example, the stacked IC device 300 can include one or more additional devices 320 disposed adjacent to the first die 110, one or more additional devices 310 disposed adjacent to the second die 130, one or more additional devices 330 disposed above (in the orientation illustrated in FIG. 3) a top die (e.g., the first die 110) of the stacked IC device 300, or a combination thereof. The additional devices 310, 320, 330 can include or correspond to other dies, passive electrical components (e.g., capacitors, inductors, etc.), interposer devices, or combinations thereof. For example, one or more of additional devices 310, 320, 330 can include a memory die or a packaged memory device. To illustrate, the additional device 330 can include a dynamic random-access memory (DRAM) device that is coupled to the first die 110, the second die 130, or both.

An additional device disposed adjacent to the second die 130, such as one of the additional device(s) 310, can be electrically connected, through the substrate 154, to one or more of the external contacts 162. For example, in FIG. 3, the additional device(s) 310 include contacts 312 electrically connected to one or more conductors of the substrate 154. In this example, the contacts 312 and the conductor(s) of the substrate 154 can provide a signal path between the additional device(s) 310 and the external contacts 162.

Additionally, or alternatively, the additional device(s) 310 can be electrically connected, through the redistribution layers 150, to the first die 110, the second die 130, the additional device(s) 320, the additional device(s) 330, or a combination thereof. For example, in FIG. 3, the additional device(s) 310 include contacts 314 electrically connected to one or more conductors of the redistribution layers 150. In this example, the contacts 314 and the conductor(s) of the redistribution layers 150 can provide signal paths between the additional device(s) 310 and the first die 110, the second die 130, the additional device(s) 320, or a combination thereof. As another example, the stacked IC device 300 optionally includes interconnect conductors 362 (e.g., interconnect conductors 362A and interconnect conductors 362B) which are electrically connected to the redistribution layers 150 and electrically connected to one or more conductors of a second substrate 350 over the first die 110. In this example, the contacts 314, the conductor(s) of the redistribution layers 150, the interconnect conductors 362, and the conductors of the second substrate 350 can provide signal paths between the additional device(s) 310 and the additional device(s) 330.

An additional device disposed adjacent to the first die 110, such as one of the additional device(s) 320, can be electrically connected, through the second substrate 350 to the additional device(s) 330. For example, in FIG. 3, the additional device(s) 320 include contacts 324 electrically connected to one or more conductors of the second substrate 350. In this example, the contacts 324 and the conductor(s) of the second substrate 350 can provide a signal path between the additional device(s) 320 and the additional device(s) 330.

Additionally, or alternatively, the additional device(s) 320 can be electrically connected, through the redistribution layers 150, to the first die 110, the second die 130, the additional device(s) 310, or a combination thereof. For example, in FIG. 3, the additional device(s) 320 include contacts 322 electrically connected to one or more conductors of the redistribution layers 150. In this example, the contacts 322 and the conductor(s) of the redistribution layers 150 can provide signal paths between the additional device(s) 320 and the first die 110, the second die 130, the additional device(s) 310, or a combination thereof. As another example, the stacked IC device 300 optionally includes interconnect conductors 352 (e.g., interconnect conductors 352A and interconnect conductors 352B) which are electrically connected to the redistribution layers 150 and electrically connected to one or more conductors of the substrate 154. In this example, the contacts 322, the conductor(s) of the redistribution layers 150, the interconnect conductors 352, and the conductors of the substrate 154 can provide signal paths between the additional device(s) 320 and the external contacts 162.

Although FIG. 3 illustrates the additional device(s) 310 and 320 as including contacts on two opposing surfaces (e.g., contacts 312 on one side of the additional devices 310 and contacts 314 on the opposite side of the additional devices 310, and contacts 322 on one side of the additional devices 320 and contacts 324 on the opposite side of the additional devices 320), in some implementations, the additional device(s) 310, the additional device(s) 320, or both, include contacts on only one side. For example, in some implementations, the contacts 312 of the additional device (s) 310 are omitted and the signal paths to the additional device(s) 310 are routed through the redistribution layers 150. In some such implementations, signal paths between the contacts 314 of the additional device(s) 310 and the external contacts 162 are routed through the interconnect conductors 352. As another example, in some implementations, the contacts 314 of the additional device(s) 310 are omitted and the signal paths to the additional device(s) 310 are routed through the substrate 154. In some such implementations, signal paths between the contacts 312 of the additional device(s) 310 and the second die 130, the first die 110, the additional device(s) 320, or the additional device(s) 330 are routed through the interconnect conductors 352.

As another example, in some implementations, the contacts 324 of the additional device(s) 320 are omitted, and the signal paths to the additional device(s) 320 are routed through the redistribution layers 150. In some such implementations, signal paths between the contacts 322 of the additional device(s) 320 and the additional device(s) 330 are routed through the interconnect conductors 362. As yet another example, in some implementations, the contacts 322 of the additional device(s) 320 are omitted and the signal paths to the additional device(s) 320 are routed through the second substrate 350. In some such implementations, signal paths between the contacts 324 of the additional device(s) 320 and the first die 110, the second die 130, the additional device(s) 310, or the external contacts 162 are routed through the interconnect conductors 362.

In the example illustrated in FIG. 3, several different types of interconnect conductors are illustrated. For example, the interconnect conductors 352A and 362A correspond to or include through mold vias (TMVs), such as copper pillars or other conductive pillars extending through the mold compound 170. The interconnect conductors 352B and 362B are components of interposer devices 358, 368, respectively. The interposer devices 358, 368 can include dies or similar discrete components that includes an interposer substrate and conductive vias extending through the interposer substrate. For example, the interposer device 358 includes conductive vias 354 extending through an interposer substrate 356, and the interposer device 368 includes conductive vias 364 extending through an interposer substrate 366. The interposer substrate 356 or 366 can include a semiconductor material, a glass or ceramic material, or an organic material (e.g., a polymer). In general, interconnect conductors can be more tightly packed (e.g., have smaller pitch) in interposer devices 358, 368 than interconnect conductors formed as TMVs. Accordingly, interposer devices 358, 368 can be used in implementations that require a larger number of interconnect conductors than can be accommodated readily using TMVs, can be used in implementations that require tighter packing of interconnect conductors than can be accommodated readily using TMVs, or that are subject to other similar constraints.

The diagram illustrated in FIG. 3 is merely schematic, and is intended to highlight particular features of the stacked IC device 300. For example, the specific number of contacts and interconnections is merely illustrative, and not limiting. Further, certain internal structures have been omitted from FIG. 3. For example, the redistribution layers 150, the substrate 154, and the second substrate 350 include internal conductive traces and vias that are interconnected to form conductive paths. Further, in FIG. 3, interconnections between the dies 110, 130, interconnections between the dies 110, 130 and the redistribution layers 150, and interconnections to the additional device(s) 310, 320, 330 are illustrated as formed using solder bumps merely to highlight where separate components of an electric connection are positioned. In other implementations, other interconnection techniques are used.

Further, although FIG. 3 illustrates both TMVs and interposer devices 358, 368 being used as interconnect conductors of the stacked IC device 300, in other implementations, the interconnect conductors are all TMVs or all routed through interposer devices. Similarly, different combinations of TMVs and interposer devices than illustrated in FIG. 3 could be used. To illustrate, connections between the redistribution layers 150 and the second substrate 350 could be provided by interposer devices and connections between the redistribution layers 150 and the substrate 154 could be provided by TMVs, or vice versa.

Although FIG. 3 illustrates the additional device(s) 330 coupled to the dies 110, 130 through the second substrate 350, in other implementations, one or more of the additional device(s) 330 are connected to the dies 110, 130 in a different manner. For example, in some implementations, the second substrate 350 is omitted and a set of redistribution layers is disposed between the additional device(s) 330 and the first die 110. As another example, in some implementations, the second substrate 350 is omitted and the interconnect conductors 362 disposed adjacent to the first die 110 are positioned to align with contacts of the additional device(s) 330. These and other examples of arrangements to connect any of the stacked IC devices 100, 200, or 300 to one or more additional devices are described further with reference to FIGS. 5-9.

Exemplary Sequence for Fabricating a Stacked IC Device

Figure 4A:
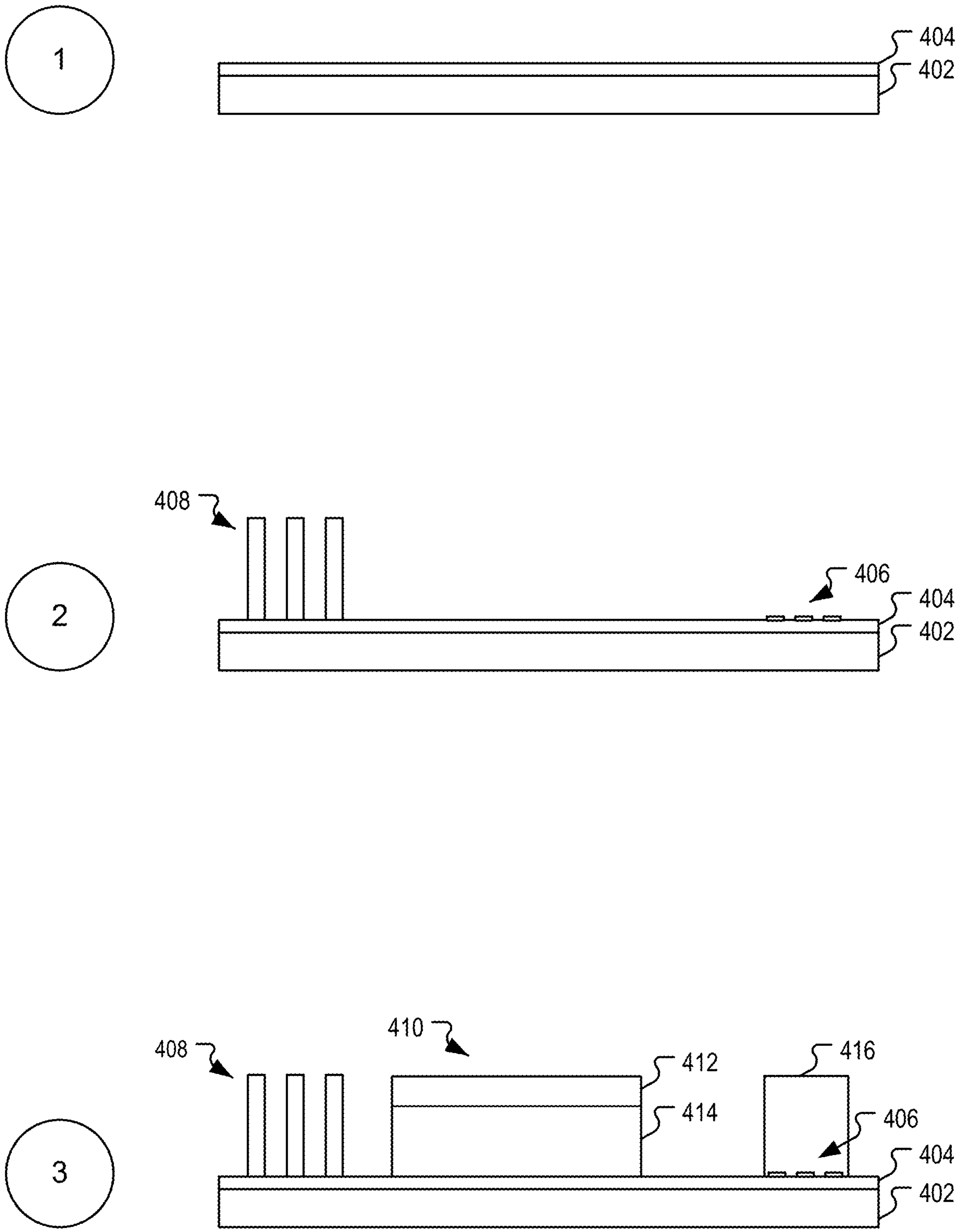
FIGS. 4A, 4B and 4C together illustrate an exemplary sequence for fabricating the exemplary stacked IC device of FIG. 1.
Figure 4B:
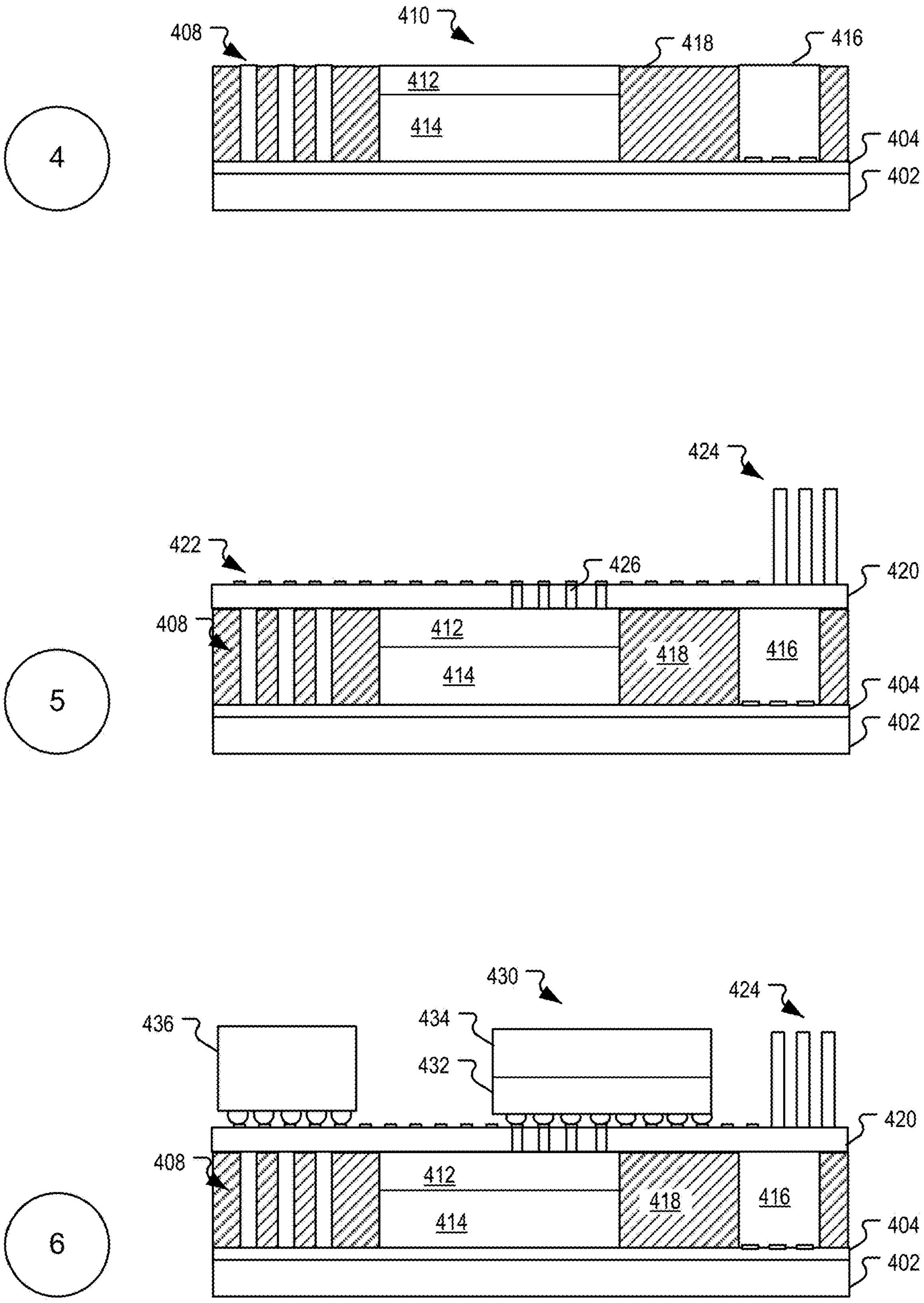
Figure 4C:
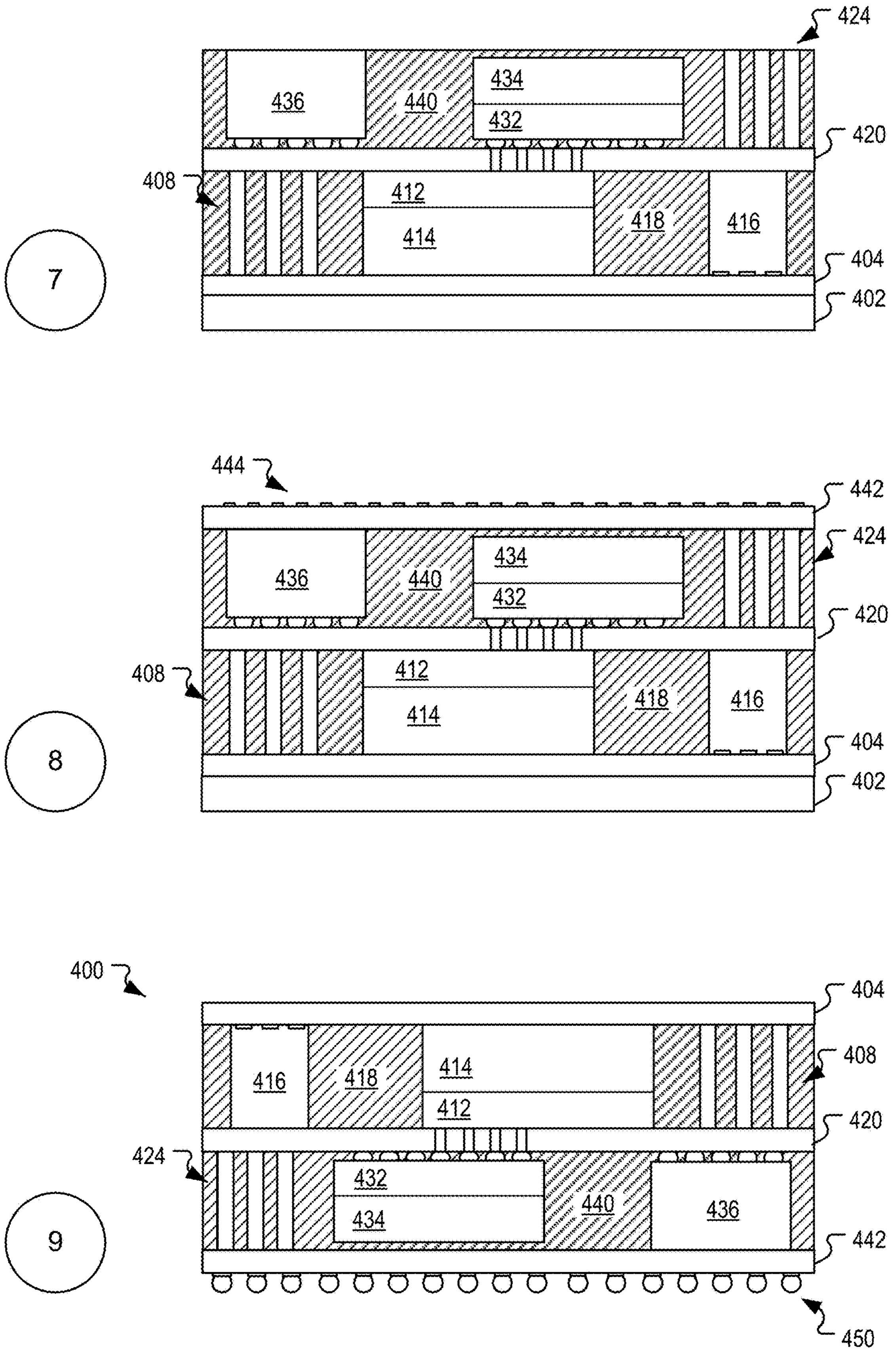

In some implementations, fabricating a stacked IC device (e.g., any of the stacked IC devices 100, 200, or 300) includes several processes. FIGS. 4A-4C illustrate an exemplary sequence for providing or fabricating a stacked IC device, as described with reference to any of FIGS. 1-3. In some implementations, the sequence of FIGS. 4A-4C may be used to provide (e.g., during fabrication of) one or more of the stacked IC devices 100, 200, 300 of FIGS. 1-3.

It should be noted that the sequence of FIGS. 4A-4C may combine one or more stages in order to simplify and/or clarify the sequence for providing or fabricating an integrated device. In some implementations, the order of the processes may be changed or modified. In some implementations, one or more of the processes may be replaced or substituted without departing from the scope of the disclosure. In the following description, reference is made to various illustrative Stages of the sequence, which are numbered (using circled numbers) in FIGS. 4A-4C. Each of the various stages of the sequence illustrated in FIGS. 4A-4C shows a single stacked IC device being formed. In other implementations, multiple stacked IC devices can be formed together concurrently.

Stage 1 of FIG. 4A illustrates a state after formation of redistribution layers 404 on a substrate 402. In some implementations, the substrate 402 is a carrier substrate that is not included in a final device that includes a stacked IC device (e.g., is not included in the device 400 illustrated at Stage 9 of FIG. 4C). In other implementations, the substrate 402 is a top substrate of the final device. For example, the substrate 402 can correspond to the second substrate 350 of FIG. 3. In such implementations, the redistribution layers 404 can be omitted or can be formed within the substrate 402. In some implementations, such as in the example illustrated in FIGS. 1 and 2, no redistribution layers or top substrate are disposed over a stacked IC device in the final device. In such implementations, the redistribution layers 404 can be omitted. The redistribution layers 404 can be formed using various deposition and patterning operations to form alternating dielectric layers and metal layers where the metal layers are patterned to form traces and selected traces of one metal layer are electrically connected to corresponding selected traces of another metal layer to form signal paths.

Stage 2 illustrates a state after contacts 406 and interconnect conductors 408 have been formed on the redistribution layers 404 (or on the substrate 402 if the redistribution layers 404 are omitted). For example, one or more plating processes and one or more patterning processes can be used to form the contacts 406, the interconnect conductors 408, or both. In some implementations, the contacts 406 are formed as part of forming the redistribution layers 404 at Stage 1. The contacts 406 and the interconnect conductors 408 include a metal, such as copper, silver, tin, another conductor, or an alloy or combination thereof. In implementations in which no redistribution layers or top substrate are disposed over a stacked IC device in the final device, the contacts 406 and the interconnect conductors 408 can be omitted. For example, the contacts 406 and the interconnect conductors 408 can be omitted during formation of the stacked IC devices 100 and 200 of FIGS. 1 and 2, respectively. In some implementations, an interposer device is used to provide signal paths to the redistribution layers 404 or the substrate 402. For example, the additional device(s) 320 of FIG. 3 can include an interposer device with through vias. In such implementations, the interconnect conductors 408 can be omitted and additional contacts 406 can be formed to connect to the interposer device.

Stage 3 illustrates a state after a first die 410 and optionally one or more additional devices 416 are disposed on (e.g., attached to) the redistribution layers 404 (or on the substrate 402 if the redistribution layers 404 are omitted). The first die 410 is positioned such that an active region 412 of the first die 410 faces away from the substrate 402 and an inactive region 414 of the first die 410 faces toward the substrate 402. The first die 410, the additional device(s) 416, or a combination thereof, can be positioned as illustrated at Stage 3 using an automated process, such as using a robot performing pick-and-place operations. In some implementations, the first die 410, is adhered to a surface of the redistribution layers 404 (or on the substrate 402). If signal paths to the additional device(s) 416 are routed through the contacts 406, the additional device(s) 416 can be coupled to the contacts 406 using solder. However, if signal paths to the additional device(s) 416 are not routed through the contacts 406 (e.g., during formation of the stacked IC devices 100 and 200 of FIGS. 1 and 2, respectively), the additional device(s) 416 can be adhered to the surface of the redistribution layers 404 (or on the substrate 402). The additional device(s) 416 can correspond to the ICD(s) 220 of FIG. 2 or any of the additional device(s) 320 of FIG. 3.

Stage 4 of FIG. 4B illustrates a state after a mold compound 418 has been used to at least partially encapsulate the first die 410 and any other optional components attached to the redistribution layers 404 or the substrate 402. The mold compound 418 can include, correspond to, or be included within (e.g., represent a portion of) the mold compound 170 of any of FIGS. 1-3. In a particular example, a deposition process, a spin-on process, or a similar process can be used to apply the mold compound 418, and the mold compound 418 can subsequently be cured or hardened by exposure to light, heat, and/or chemical hardening agents.

Stage 5 illustrates a state after formation of redistribution layers 420 and formation of contacts 422 and optionally interconnect conductors 424. The redistribution layers 420 correspond to the redistribution layers 150 of any of FIGS. 1-3. The redistribution layers 420 are electrically connected to circuitry disposed in the active region 412 of the first die 410 and provide signal paths 426 to connect the circuitry to circuitry of another die (e.g., a second die 430 illustrated at Stage 6). When the interconnect conductors 408 are present, the redistribution layers 420 are electrically connected to the interconnect conductors 408 and provide signal paths 426 to the first die 410, to the contacts 422, to one or more of the additional device(s) 416, or a combination thereof. Additionally, when the additional device(s) 416 are present, the redistribution layers 420 can be electrically connected to the additional device(s) 416 and provide signal paths 426 to the first die 410, to the contacts 422, to interconnect conductors 408, or a combination thereof. The redistribution layers 420 can be formed using various deposition and patterning operations to form alternating dielectric layers and metal layers where the metal layers are patterned to form traces and selected traces of one metal layer are electrically connected to corresponding selected traces of another metal layer to form signal paths. One or more plating processes and one or more patterning processes can be used to form the contacts 422, the interconnect conductors 424, or both on the redistribution layers 420. The contacts 422 and the interconnect conductors 424 include a metal, such as copper, silver, tin, another conductor, or an alloy or combination thereof. In some implementations, an interposer device is used to provide signal paths from the redistribution layers 420 to external contacts (e.g., the external contacts 162 of FIGS. 1-3, or external contacts 444 illustrated at Stage 8 of FIG. 4C). For example, the additional device(s) 310 of FIG. 3 can include an interposer device with through vias. In such implementations, the interconnect conductors 424 can be omitted and additional contacts 422 can be formed to connect to the interposer device.

Stage 6 illustrates a state after a second die 430 and optionally one or more additional devices 436 are disposed on (e.g., attached to) the redistribution layers 420. The second die 430 is positioned such that an active region 432 of the second die 430 faces the redistribution layers 420 (i.e., such that the first die 410 and the second die 430 are face-to-face) and an inactive region 434 is oriented away from the redistribution layers 420. The second die 430, the additional device(s) 436, or a combination thereof, can be positioned as illustrated at Stage 6 using an automated process, such as using a robot performing pick-and-place operations. In some implementations, the second die 430 is electrically connected to at least a first subset of the contacts 422 of the redistribution layer 420 (e.g., using solder, copper pillars, pad-to-pad bonding, or a similar process) to provide signal paths between circuitry in the active region 432 of the second die 430 and circuitry in the active region 412 of the first die 410. The second die 430 is also electrically connected to at least a second subset of the contacts 422 of the redistribution layer 420 (e.g., using solder, copper pillars, pad-to-pad bonding, or a similar process) to provide signal paths between circuitry in the active region 432 of the second die 430 and other components. For example, the second die 430 may be electrically connected to contacts 422 that provide signal path(s) between the second die 430 and the additional device(s) 436, the additional device(s) 416, the interconnect conductors 424, the interconnect conductors 408, one or more interposer devices, or any combination thereof.

Stage 7 of FIG. 4C illustrates a state after a mold compound 440 has been used to at least partially encapsulate the second die 430 and any other optional components attached to the redistribution layers 420 (e.g., the additional device(s) 436 and/or the interconnect conductors 424). The mold compound 440 can include, correspond to, or be included within (e.g., represent a portion of) the mold compound 170 of any of FIGS. 1-3. In a particular example, a deposition process, a spin-on process, or a similar process can be used to apply the mold compound 440, and the mold compound 440 can subsequently be cured or hardened by exposure to light, heat, and/or chemical hardening agents.

Stage 8 illustrates a state after a substrate 442 including external contacts 444 is formed on or coupled to the assembled components of Stage 7. In some implementations, the substrate 442 is preformed and the state illustrated at Stage 8 is achieved by physically and electrically connecting the preformed substrate 442 to the assembled components of Stage 7. For example, the interconnect conductors 424 can be electrically connected to conductors of the substrate 442 to provide signal paths from the interconnect conductors 424 to appropriate ones of the external contacts 444. In other implementations, the substrate 442 is formed using various deposition and patterning operations to form alternating dielectric layers and metal layers where the metal layers are patterned to form traces and selected traces of one metal layer are electrically connected to corresponding selected traces of another metal layer to form signal paths.

Stage 9 illustrates a state after the substrate 402 is removed from the device 400 and optionally, after solder balls have been attached to the external contacts 444 to form a ball grid array 450. If multiple instances of the device 400 are being formed concurrently, individualization operations (e.g., cutting to separate the devices) can also be performed between Stages 8 and 9. In some implementations, the device 400 includes a second substrate, in which case the substrate 402 may not be removed between Stages 8 and 9. Formation of the devices 400 is complete after Stage 9 of FIG. 4C. However, in some implementations, one or more of the devices 400 can be integrated within a larger device (e.g., one of the devices 500, 600, 700, 800, or 900 of FIGS. 5-9).

Exemplary Packaged Devices that Include a Stacked IC Device

FIGS. 5-9 illustrate various examples of packaged IC devices that include a stacked IC device 502 and one or more additional devices 504. In each of FIGS. 5-9, the stacked IC device 502 can include or correspond to any of the stacked IC devices 100, 200, 300 of FIGS. 1-3. For example, the stacked IC device 502 of FIGS. 5-9 includes the first die 110 and the second die 130 coupled face-to-face, the redistribution layers 150, and the interconnect conductors 152, which are external to the first die 110 and external to the second die 130 and are electrically connected to the redistribution layers 150 to provide signal paths from the first die 110, the second die 130, or both, to the external contacts 162 of the substrate 154. Further, the additional device(s) 504 can correspond to or include any of the additional devices 310, 320, 330, the ICD(s) 220, 240, other passive devices, other semiconductor dies, or combinations thereof. For example, one of the additional devices(s) 504 can include an application specific integrated circuit, a field programmable gate array, a memory device, a processor, a communications device, or other circuits.

Figure 5:
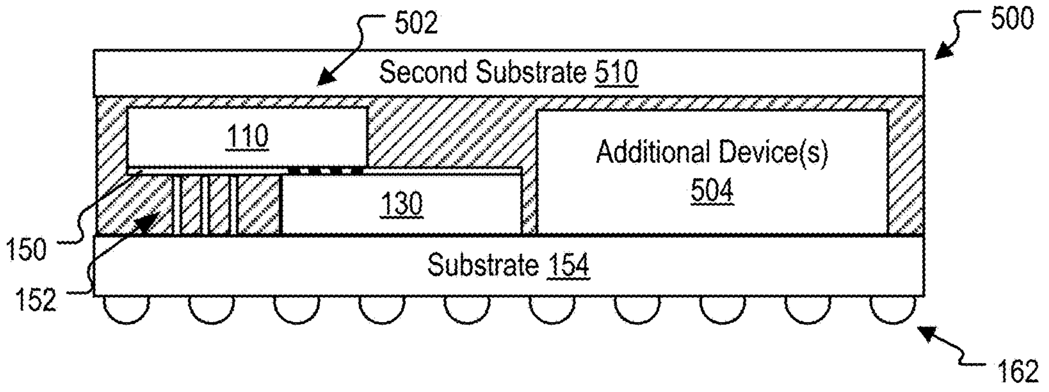
FIG. 5 illustrates a schematic cross-sectional view of an example of a device that includes the exemplary stacked IC device of FIG. 1.

FIG. 5 illustrates an example of a packaged IC device 500 having a dual substrate configuration. For example, in FIG. 5, the stacked IC device 502 and one or more of the additional device(s) 504 are disposed between the substrate 154 and a second substrate 510. The second substrate 510 can, for example, stiffen the packaged IC device 500 to reduce warpage. The second substrate 510 is optional, and can be omitted in some implementations.

Figure 6:
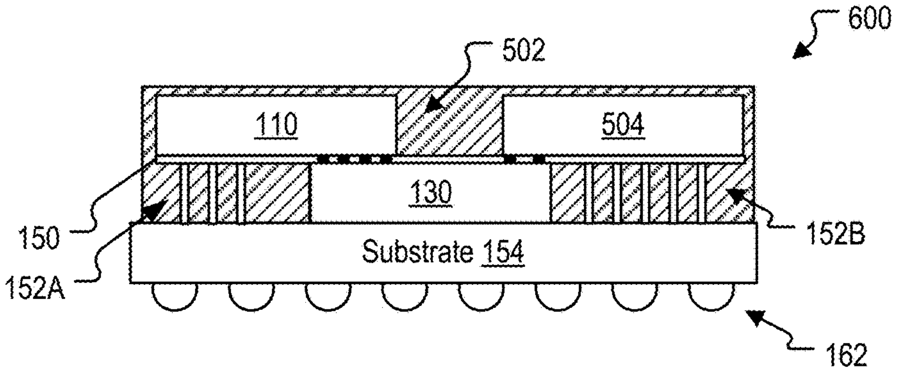
FIG. 6 illustrates a schematic cross-sectional view of an example of a device that includes the exemplary stacked IC device of FIG. 1.

FIG. 6 illustrates an example of a packaged IC device 600 in which the redistribution layers 150 are extended to enable stacking of the additional device(s) 504. In this example, the interconnect conductors 152 can include interconnect conductors 152A for routing signals between the stacked IC device 502 and the external contacts 162 and interconnect conductors 152B for routing signals between the additional device(s) 504 and the external contacts 162.

Figure 7:
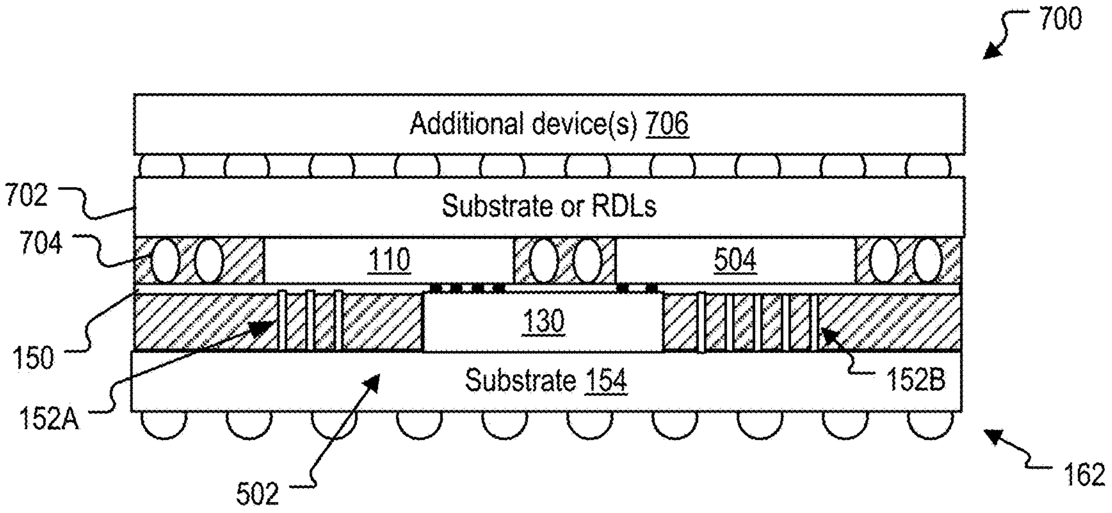
FIG. 7 illustrates a schematic cross-sectional view of an example of a device that includes the exemplary stacked IC device of FIG. 1.

FIG. 7 illustrates an example of a packaged IC device 700 having a molded embedded package (MEP) structure. For example, in FIG. 7, the packaged IC device 700 includes the stacked IC device 502 and optionally one or more of the additional device(s) 504 disposed between the substrate 154 and a second substrate 702. Optionally, the second substrate 702 can include a set of redistribution layers. Interconnect conductors 704 are electrically connected to the redistribution layers 150 and to the second substrate 702 and configured to provide signal paths between one or more additional devices 706 mounted on the second substrate 702 and other devices of the packaged IC device 700, the external contacts 162, or both. For example, the interconnect conductors 704 can provide signal paths between the additional devices 706 and the first die 110, the second die 130, one or more of the additional device(s) 504, or a combination thereof.

Figure 8:
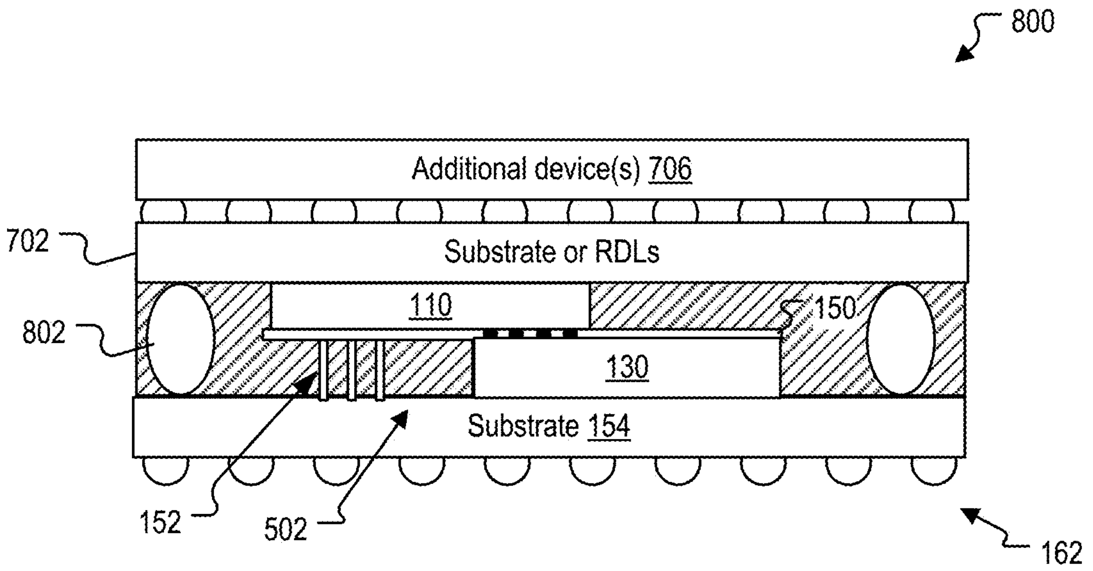
FIG. 8 illustrates a schematic cross-sectional view of an example of a device that includes the exemplary stacked IC device of FIG. 1.

FIG. 8 illustrates another example of a packaged IC device 800 having a molded embedded package (MEP) structure. For example, in FIG. 8, the packaged IC device 800 includes the stacked IC device 502 and optionally one or more of the additional device(s) 504 (not shown in FIG. 8) disposed between the substrate 154 and a second substrate 702. Optionally, the second substrate 702 can include a set of redistribution layers. Interconnect conductors 802 are electrically connected to the substrate 154 and to the second substrate 702 and configured to provide signal paths between one or more additional devices 706 mounted on the second substrate 702 and other devices of the packaged IC device 800, the external contacts 162, or both. For example, the interconnect conductors 802 can provide signal paths between the additional devices 706 and the first die 110, the second die 130, one or more of the additional device(s) 504, or a combination thereof.

Figure 9:
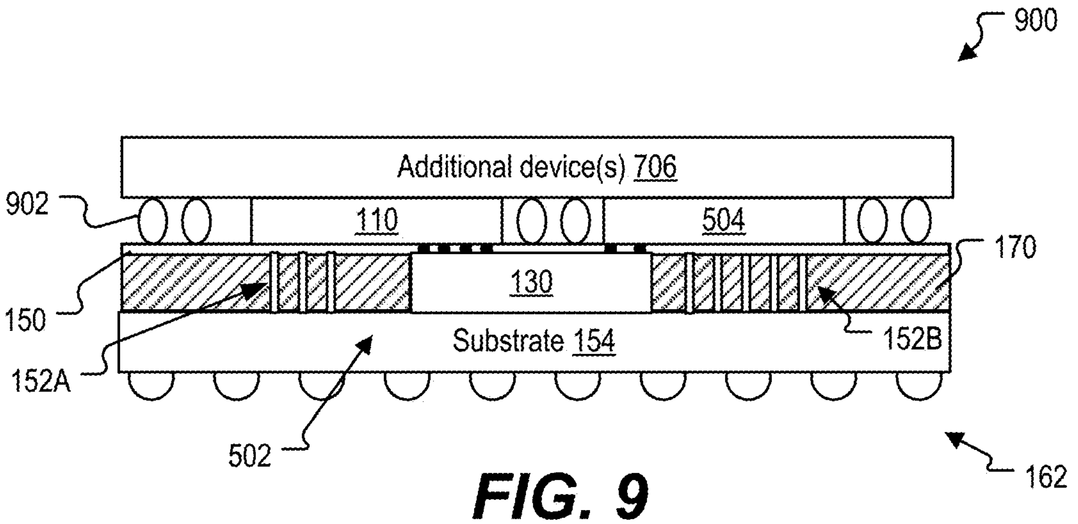
FIG. 9 illustrates a schematic cross-sectional view of an example of a device that includes the exemplary stacked IC device of FIG. 1.

FIG. 9 illustrates an example of a packaged IC device 900 in which interconnect conductors 902 coupled to the redistribution layers 150 are coupled to the additional device(s) 706. In some implementations of the packaged IC device 900, the mold compound 170 is omitted from at least a portion of a region between the redistribution layers 150 and the additional device(s) 706, which provides improved heat management.

The specific examples illustrated in FIGS. 5-9 are merely illustrative, and are not limiting. In other implementations, the stacked IC device 502 can be used with package structures other than those specifically illustrated.

While each of FIGS. 1-9 illustrate examples of stacked IC devices that include at least two dies, in other examples, a stacked IC device can include more than two dies, and any two such dies can be positioned and interconnected as described herein. Further, a device that includes one or more of the stacked IC devices disclosed herein can include components such as a power management integrated circuit (PMIC), an application processor, a modem, a radio frequency (RF) device, a passive device, a filter, a capacitor, an inductor, a transmitter, a receiver, a gallium arsenide (GaAs) based integrated device, a surface acoustic wave (SAW) filter, a bulk acoustic wave (BAW) filter, a light emitting diode (LED) integrated device, a silicon (Si) based integrated device, a silicon carbide (SiC) based integrated device, a memory, power management processor, and/or combinations thereof. In such devices, the stacked IC device can operate as any of these components (or a combination of these components) that includes active circuitry.

Exemplary Flow Diagram of a Method for Fabricating a Stacked IC Device

Figure 10:
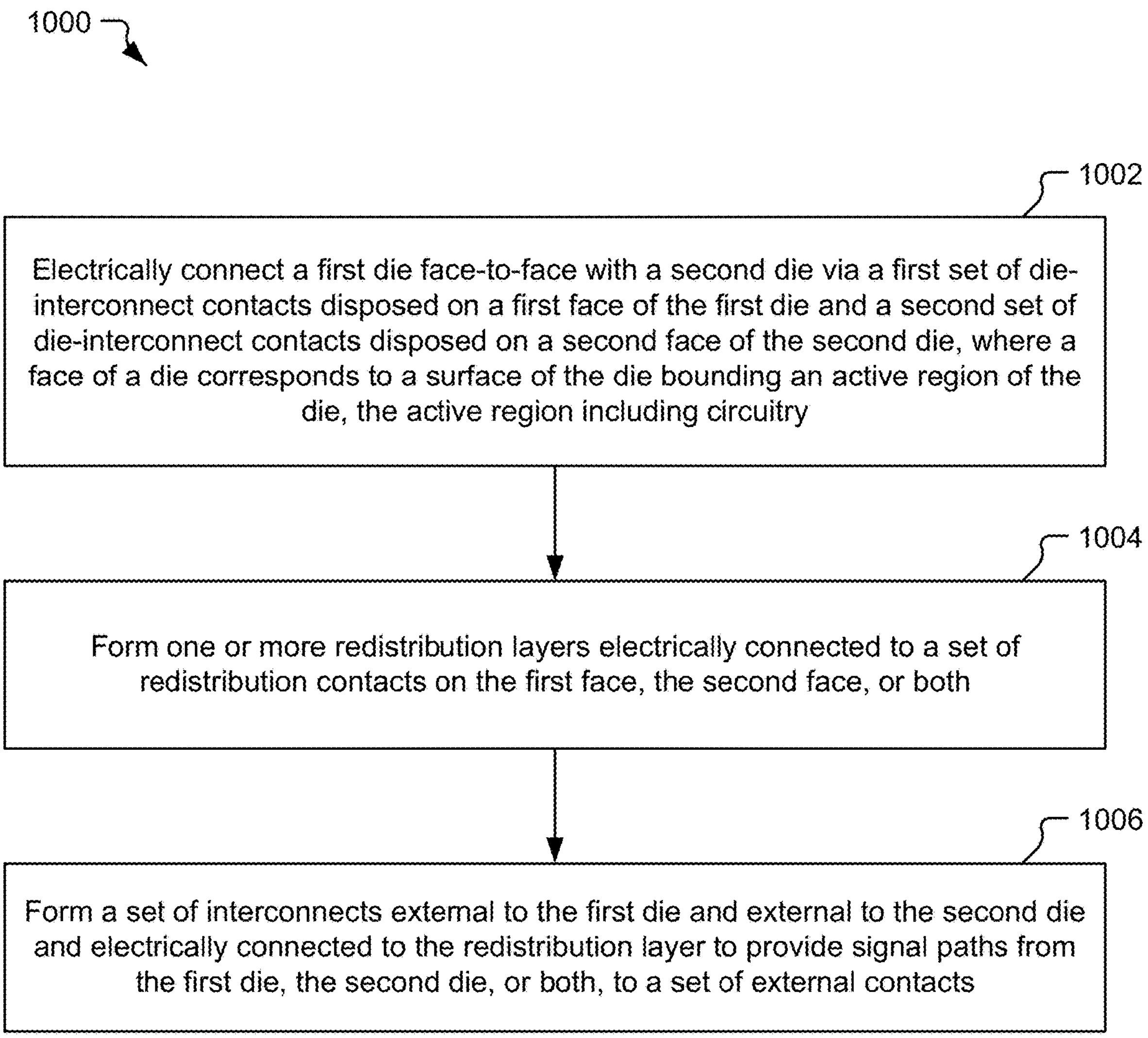
FIG. 10 illustrates an exemplary flow diagram of a method for fabricating an exemplary stacked IC device.

In some implementations, fabricating a stacked IC device includes several processes. FIG. 10 illustrates an exemplary flow diagram of a method 1000 for providing or fabricating a stacked IC device. In some implementations, the method 1000 of FIG. 10 may be used to provide or fabricate any of the stacked IC devices 100, 200, 300, 400, or 502 of FIGS. 1-9.

It should be noted that the method 1000 of FIG. 10 may combine one or more processes in order to simplify and/or clarify the method for providing or fabricating an integrated device. In some implementations, the order of the processes may be changed or modified.

The method 1000 includes, at block 1002, electrically connecting a first die face-to-face with a second die via a first set of die-interconnect contacts disposed on a first face of the first die and a second set of die-interconnect contacts disposed on a second face of the second die, where a face of a die corresponds to a surface of the die bounding an active region of the die, the active region including circuitry. For example, the first die 110 of any of FIG. 1-3 or 5-9 can be electrically connected face-to-face with the second die 130. As illustrated in the FIGS. 1 and 3, in this arrangement, the first die-interconnect contacts 122 of the first die 110 are electrically connected to the second die-interconnect contacts 142 of the second die 110.

The method 1000 also includes, at block 1004, forming one or more redistribution layers electrically connected to a set of redistribution contacts on the first face, the second face, or both. For example, the redistribution layers 150 of any of FIG. 1-3 or 5-9 can be electrically connected to redistribution contacts 124 of the first die 110, to redistribution contacts 144 of the second die 130, or both.

Stages 4 to 6 illustrate and describe examples of operations that can be used to electrically connect a first die face-to-face with a second die via a first set of die-interconnect contacts disposed on a first face of the first die and a second set of die-interconnect contacts disposed on a second face of the second die and to form one or more redistribution layers electrically connected to a set of redistribution contacts on the first face, the second face, or both. For example, the first die 410 can be positioned face up (in the orientation illustrated in FIG. 4B at Stage 4) and the redistribution layers 420 can be formed on the first die 410 and electrically connected to the first die 410. Contacts 422 can be formed on the redistribution layers 420, and the second die 430 can be positioned face down (in the orientation illustrated in FIG. 4B at Stage 6) and electrically connected to the contacts 422 such that the signal paths 426 are formed between die-interconnect contacts of the first and second dies, and such that the signal paths 426 are formed between other contacts of the first die, the second die, or both, and other components, such as the additional device(s) 416, the additional device(s) 436, the external contacts 444, or a combination thereof.

The method 1000 also includes, at block 1006, forming a set of interconnects external to the first die and external to the second die and electrically connected to the redistribution layer to provide signal paths from the first die, the second die, or both, to a set of external contacts. For example, the set of interconnects external to the first die and external to the second die can include or correspond to the interconnect conductors 152 of FIG. 1 or FIG. 2. As another example, the set of interconnects external to the first die and external to the second die can include or correspond to the interconnect conductors 352 or 362 of FIG. 3, or through vias (e.g., through silicon vias or through glass vias) of one of the interposer devices 358, 368 of FIG. 3.

In some implementations, the method 1000 includes coupling a back of the second die (where the back of the second die is opposite the second face) to a first side of a substrate. In such implementations, the external contacts are coupled to a second side of the substrate. For example, in FIG. 1, the back 134 of the second die 130 is coupled to the first side 156 of the substrate 154 and the external contacts 162 are disposed on the second side 158 of the substrate 154. Stages 8 and 9 of FIG. 4C illustrate and describe operations to couple the back of the second die to the first side of a substrate.

In some implementations, the first die is devoid of through-silicon vias. In some such implementations, the first die includes a first back and a first inactive region adjacent to the first back, and the first back is devoid of electrical contacts. Further, in some implementations, the second die is also, or alternatively, devoid of through-silicon vias. In some such implementations, the second die includes a second back and a second inactive region adjacent to the second back, and the second back is devoid of electrical contacts.

In some implementations, the method 1000 also includes electrically connecting the first die, the second die, or both, to one or more additional devices. In some such implementations, signal paths between the first die and one of the additional device(s), signal paths between the second die and one of the additional device(s), or both, can be routed through the redistribution layers. For example, the first die 110, the second die 130, or both, can be electrically connected to any of the additional device(s) 310, 320, 330 via conductors of the redistribution layers 150. In some such implementations, signal paths between the first die and one of the additional device(s), signal paths between the second die and one of the additional device(s), or both, can be routed through a substrate. For example, the first die 110, the second die 130, or both, can be electrically connected to any of the additional device(s) 310, 320, 330 via conductors of the substrate 154 or the substrate 350. The additional device(s) 310, 320, 330 can include, for example, additional dies (e.g., memory), passive components (e.g., integrated capacitive devices), interposer devices, etc.

In some implementations, the method 1000 also includes at least partially encapsulating the first die, the second die, the one or more redistribution layers, and the set of interconnects in a mold compound. Examples of operations to form the mold compound 418 and 440 are described with reference to Stages 4 of FIGS. 4B and 7 of FIG. 4C. In some implementations, the method 1000 also includes forming one or more through-mold vias. For example, at least one interconnect of the set of interconnects may include a through-mold via. Examples of operations to form the interconnect conductors 408 and 424 as through-mold vias are described with reference to Stages 2 of FIGS. 4A and 5 of FIG. 4B.

Exemplary Electronic Devices

Figure 11:
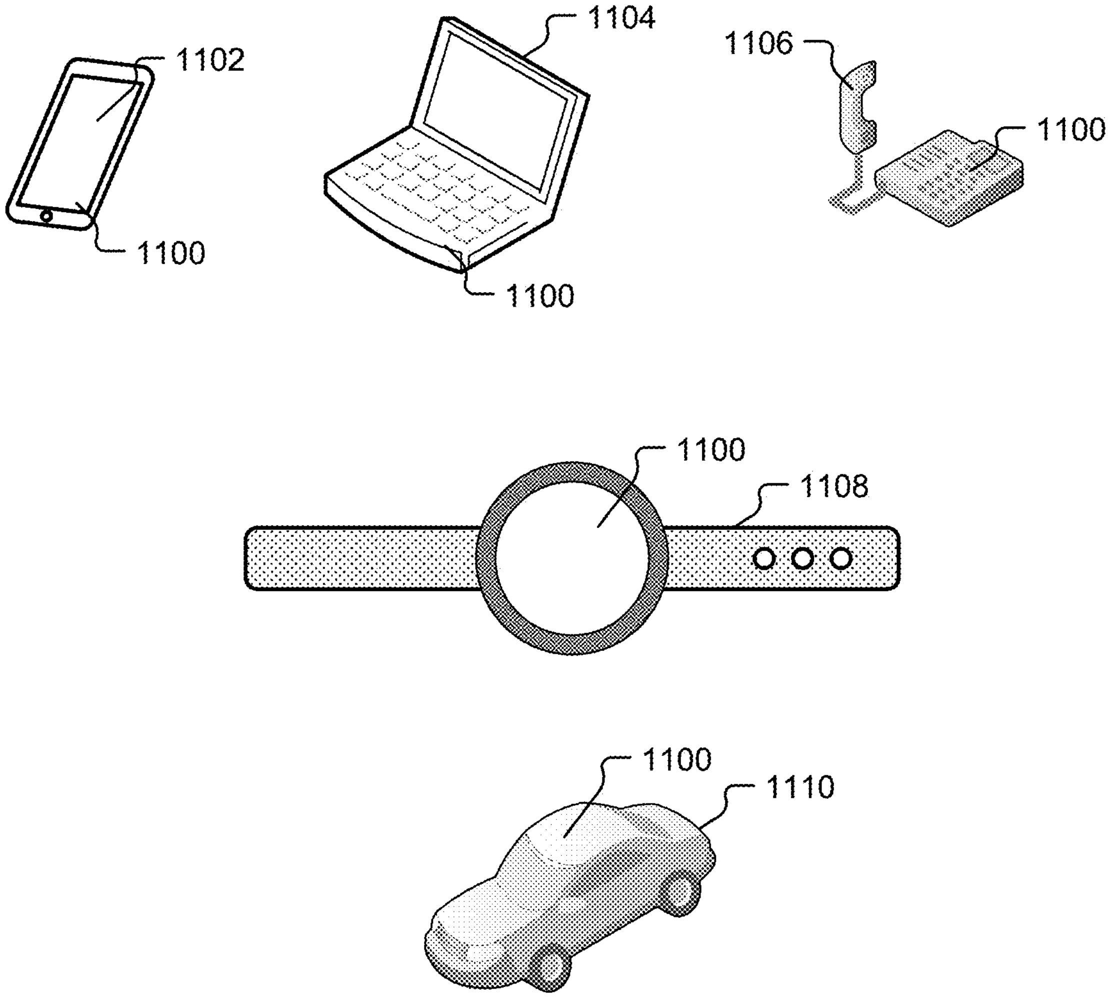
FIG. 11 illustrates various electronic devices that may integrate a die, an electronic circuit, an integrated device, an integrated passive device (IPD), a passive component, a package, and/or a device package described herein.

FIG. 11 illustrates various electronic devices that may include or be integrated with any of the stacked IC devices 100, 200, 300, 400, 502 of any of FIGS. 1-9. For example, a mobile phone device 1102, a laptop computer device 1104, a fixed location terminal device 1106, a wearable device 1108, or a vehicle 1110 (e.g., an automobile or an aerial device) may include a device 1100. The device 1100 can include, for example, any of the devices 500, 600, 700, 800, or 900 and/or any of the 100, 200, 300, 400, 502 described herein. The devices 1102, 1104, 1106 and 1108 and the vehicle 1110 illustrated in FIG. 11 are merely exemplary. Other electronic devices may also feature the device 1100 including, but not limited to, a group of devices (e.g., electronic devices) that includes mobile devices, hand-held personal communication systems (PCS) units, portable data units such as personal digital assistants, global positioning system (GPS) enabled devices, navigation devices, set top boxes, music players, video players, entertainment units, fixed location data units such as meter reading equipment, communications devices, smartphones, tablet computers, computers, wearable devices (e.g., watches, glasses), Internet of things (IoT) devices, servers, routers, electronic devices implemented in vehicles (e.g., autonomous vehicles), or any other device that stores or retrieves data or computer instructions, or any combination thereof.

One or more of the components, processes, features, and/or functions illustrated in FIGS. 1-11 may be rearranged and/or combined into a single component, process, feature, or function or embodied in several components, processes, or functions. Additional elements, components, processes, and/or functions may also be added without departing from the disclosure. It should also be noted FIGS. 1-11 and its corresponding description in the present disclosure is not limited to dies and/or ICs. In some implementations, FIGS. 1-11 and its corresponding description may be used to manufacture, create, provide, and/or produce devices and/or integrated devices. In some implementations, a device may include a die, an integrated device, an integrated passive device (IPD), a die package, an IC device, a device package, an IC package, a wafer, a semiconductor device, a package-on-package (POP) device, a heat dissipating device and/or an interposer.

It is noted that the figures in the disclosure may represent actual representations and/or conceptual representations of various parts, components, objects, devices, packages, integrated devices, integrated circuits, and/or transistors. In some instances, the figures may not be to scale. In some instances, for purpose of clarity, not all components and/or parts may be shown. In some instances, the position, the location, the sizes, and/or the shapes of various parts and/or components in the figures may be exemplary. In some implementations, various components and/or parts in the figures may be optional.

The word "exemplary" is used herein to mean "serving as an example, instance, or illustration." Any implementation or aspect described herein as "exemplary" is not necessarily to be construed as preferred or advantageous over other aspects of the disclosure. Likewise, the term "aspects" does not require that all aspects of the disclosure include the discussed feature, advantage or mode of operation. The term "coupled" is used herein to refer to the direct or indirect coupling (e.g., mechanical coupling) between two objects. For example, if object A physically touches object B, and object B touches object C, then objects A and C may still be considered coupled to one another-even if they do not directly physically touch each other. An object A, that is coupled to an object B, may be coupled to at least part of object B. The term "electrically coupled" may mean that two objects are directly or indirectly coupled together such that an electrical current (e.g., signal, power, ground) may travel between the two objects. Two objects that are electrically coupled may or may not have an electrical current traveling between the two objects. The use of the terms "first," "second," "third," and "fourth" (and/or anything above fourth) is arbitrary. Any of the components described may be the first component, the second component, the third component or the fourth component. For example, a component that is referred to as a second component, may be the first component, the second component, the third component or the fourth component. The terms "encapsulate." "encapsulating" and/or any derivation means that the object may partially encapsulate or completely encapsulate another object. The terms "top" and "bottom" are arbitrary. A component that is located on top may be located over a component that is located on a bottom. A top component may be considered a bottom component, and vice versa. As described in the disclosure, a first component that is located "over" a second component may mean that the first component is located above or below the second component, depending on how a bottom or top is arbitrarily defined. In another example, a first component may be located over (e.g., above) a first surface of the second component, and a third component may be located over (e.g., below) a second surface of the second component, where the second surface is opposite to the first surface. It is further noted that the term "over" as used in the present application in the context of one component located over another component, may be used to mean a component that is on another component and/or in another component (e.g., on a surface of a component or embedded in a component). Thus, for example, a first component that is over the second component may mean that (1) the first component is over the second component, but not directly touching the second component, (2) the first component is on (e.g., on a surface of) the second component, and/or (3) the first component is in (e.g., embedded in) the second component. A first component that is located "in" a second component may be partially located in the second component or completely located in the second component. A value that is about X-XX, may mean a value that is between X and XX, inclusive of X and XX. The value(s) between X and XX may be discrete or continuous. The term "about 'value X'", or "approximately value X", as used in the disclosure means within 10 percent of the 'value X'. For example, a value of about 1 or approximately 1, would mean a value in a range of 0.9-1.1. A "plurality" of components may include all the possible components or only some of the components from all of the possible components. For example, if a device includes ten components, the use of the term "the plurality of components" may refer to all ten components or only some of the components from the ten components.

In some implementations, an interconnect is an element or component of a device or package that allows or facilitates an electrical connection between two points, elements and/or components. In some implementations, an interconnect may include a trace, a via, a pad, a pillar, a metallization layer, a redistribution layer, and/or an under bump metallization (UBM) layer/interconnect. In some implementations, an interconnect may include an electrically conductive material that may be configured to provide an electrical path for a signal (e.g., a data signal), ground and/or power. An interconnect may include more than one element or component. An interconnect may be defined by one or more interconnects. An interconnect may include one or more metal layers. An interconnect may be part of a circuit. Different implementations may use different processes and/or sequences for forming the interconnects. In some implementations, a chemical vapor deposition (CVD) process, a physical vapor deposition (PVD) process, a sputtering process, a spray coating, and/or a plating process may be used to form the interconnects.

Also, it is noted that various disclosures contained herein may be described as a process that is depicted as a flowchart, a flow diagram, a structure diagram, or a block diagram. Although a flowchart may describe the operations as a sequential process, many of the operations can be performed in parallel or concurrently. In addition, the order of the operations may be re-arranged. A process is terminated when its operations are completed.

In the following, further examples are described to facilitate the understanding of the disclosure.

According to Example 1, a stacked integrated circuit (IC) device includes a first die having a first face, a first active region adjacent to the first face, first circuitry disposed in the first active region, and first die-interconnect contacts disposed on the first face and electrically connected to the first circuitry; a second die having a second face, a second active region adjacent to the second face, second circuitry disposed in the second active region, and second die-interconnect contacts disposed on the second face and electrically connected to the second circuitry, wherein the first face is oriented toward the second face, and wherein the first die-interconnect contacts are electrically connected to the second die-interconnect contacts; a set of redistribution layers electrically connected to redistribution contacts on the first face, the second face, or both; and interconnect conductors external to the first die and external to the second die and electrically connected to the redistribution layers to provide signal paths from the first die, the second die, or both, to a set of external contacts.

Example 2 includes the stacked IC device of Example 1, further comprising a substrate, wherein a back of the second die is coupled to a first side of the substrate and the external contacts are coupled to a second side of the substrate, and wherein the back of the second die is opposite the second face.

Example 3 includes the stacked IC device of Example 1 or Example 2, wherein the first die is devoid of through-silicon vias.

Example 4 includes the stacked IC device of any of Examples 1 to 3, wherein the first die further comprises a first back and a first inactive region adjacent to the first back, and wherein the first back is devoid of electrical contacts.

Example 5 includes the stacked IC device of any of Examples 1 to 4, wherein the second die is devoid of through-silicon vias.

Example 6 includes the stacked IC device of any of Examples 1 to 5, wherein the second die further comprises a second back and a second inactive region adjacent to the second back, and wherein the second back is devoid of electrical contacts.

Example 7 includes the stacked IC device of any of Examples 1 to 6, wherein the first circuitry includes one or more first transistors and a first power distribution network (PDN), and wherein the second circuitry includes one or more second transistors and a second PDN.

Example 8 includes the stacked IC device of Example 7, wherein the first PDN is electrically connected to the second PDN through the first die-interconnect contacts and the second die-interconnect contacts.

Example 9 includes the stacked IC device of Example 7 or Example 8, wherein the one or more first transistors are electrically connected to the one or more second transistors through the first die-interconnect contacts and the second die-interconnect contacts.

Example 10 includes the stacked IC device of any of Examples 7 to 9 and further includes at least one first integrated capacitor device (ICD) disposed between the first face and the set of external contacts and electrically connected to the first PDN.

Example 11 includes the stacked IC device of any of Examples 7 to 10 and further includes at least one second ICD disposed adjacent to the first die and electrically connected to the second PDN.

Example 12 includes the stacked IC device of any of Examples 1 to 11 and further includes an interposer device comprising a plurality of conductive vias electrically connected to the redistribution layers and to a plurality of the external contacts.

Example 13 includes the stacked IC device of any of Examples 1 to 12 and further includes mold compound at least partially encapsulating the first die, the second die, the redistribution layers, and the interconnect conductors.

Example 14 includes the stacked IC device of Example 13, wherein at least one of the interconnect conductors includes a through-mold via.

Example 15 includes the stacked IC device of any of Examples 1 to 14 and further includes at least one additional device disposed adjacent to the first die and electrically connected to the first circuitry, the second circuitry, or both, through the redistribution layers.

Example 16 includes the stacked IC device of any of Examples 1 to 15 and further includes at least one additional device disposed adjacent to the second die and electrically connected to the first circuitry, the second circuitry, or both, through the interconnect conductors and the redistribution layers.

Example 17 includes the stacked IC device of any of Examples 1 to 16 and further includes at least one additional device and second interconnect conductors, wherein the first die is disposed between the at least one additional device and the redistribution layers, and wherein additional circuitry of the at least one additional device is electrically connected to the first circuitry, the second circuitry, or both, through the second interconnect conductors and the redistribution layers.

Example 18 includes the stacked IC device of any of Examples 1 to 17, wherein the first die is a first chiplet and the second die is a second chiplet designed to operate in conjunction with the first chiplet.

Example 19 includes the stacked IC device of Example 18, wherein the first circuitry includes one or more first functional circuit blocks and the second circuitry includes one or more second functional circuit blocks, and wherein the one or more first functional circuit blocks and the one or more second functional circuit blocks are operationally dependent upon one another.

According to Example 20, a method includes electrically connecting a first die face-to-face with a second die using first die-interconnect contacts disposed on a first face of the first die and second die-interconnect contacts disposed on a second face of the second die, wherein a face of a die corresponds to a surface of the die bounding an active region of the die, the active region including circuitry; forming a set of redistribution layers electrically connected to redistribution contacts on the first face, the second face, or both; and forming interconnect conductors external to the first die and external to the second die and electrically connected to the redistribution layers to provide signal paths from the first die, the second die, or both, to a set of external contacts.

Example 21 includes the method of Example 20, further comprising coupling a back of the second die to a first side of a substrate, wherein the external contacts are coupled to a second side of the substrate, and wherein the back of the second die is opposite the second face.

Example 22 includes the method of Example 20 or Example 21, wherein the first die is devoid of through-silicon vias.

Example 23 includes the method of any of Examples 20 to 22, wherein the first die further comprises a first back and a first inactive region adjacent to the first back, and wherein the first back is devoid of electrical contacts.

Example 24 includes the method of any of Examples 20 to 23, wherein the second die is devoid of through-silicon vias.

Example 25 includes the method of any of Examples 20 to 24, wherein the second die further comprises a second back and a second inactive region adjacent to the second back, and wherein the second back is devoid of electrical contacts.

Example 26 includes the method of any of Examples 20 to 25, wherein a first active region of the first die includes first circuitry including one or more first transistors and a first power distribution network (PDN), and wherein a second active region of the second die includes second circuitry including one or more second transistors and a second PDN.

Example 27 includes the method of Example 26, wherein electrically connecting the first die face-to-face with the second die includes electrically connecting the first PDN to the second PDN through the first die-interconnect contacts and the second die-interconnect contacts.

Example 28 includes the method of Example 26 or Example 27, wherein electrically connecting the first die face-to-face with the second die includes electrically connecting the one or more first transistors to the one or more second transistors through the first die-interconnect contacts and the second die-interconnect contacts.

Example 29 includes the method of any of Examples 26 to 28 and further includes electrically connecting at least one first integrated capacitor device (ICD) disposed between the first face and the set of external contacts to the first PDN.

Example 30 includes the method of any of Examples 26 to 29 and further includes electrically connecting at least one second ICD disposed adjacent to the first die to the second PDN.

Example 31 includes the method of any of Examples 26 to 30 and further includes electrically connecting an interposer device to the redistribution layers and to a plurality of the external contacts, wherein the interposer device comprises a plurality of conductive vias.

Example 32 includes the method of any of Examples 20 to 31 and further includes at least partially encapsulating the first die, the second die, the redistribution layers, and the interconnect conductors in a mold compound.

Example 33 includes the method of Example 32 and further includes forming one or more through-mold vias, wherein at least one of the interconnect conductors includes a through-mold via.

Example 34 includes the method of any of Examples 20 to 33 and further includes electrically connecting at least one additional device to first circuitry of the first die, second circuitry of the second die, or both, through the redistribution layers.

According to Example 35, a device includes a substrate having a set of external contacts on a second side; and a stacked integrated circuit (IC) device on a first side of the substrate, the stacked IC device includes a first die having a first face, a first active region adjacent to the first face, first circuitry disposed in the first active region, and first die-interconnect contacts disposed on the first face and electrically connected to the first circuitry; a second die having a second face, a second active region adjacent to the second face, second circuitry disposed in the second active region, and second die-interconnect contacts disposed on the second face and electrically connected to the second circuitry, wherein the first face is oriented toward the second face, and wherein the first die-interconnect contacts are electrically connected to the second die-interconnect contacts; a set of redistribution layers electrically connected to redistribution contacts on the first face, the second face, or both; and interconnect conductors external to the first die and external to the second die and electrically connected to the redistribution layers to provide signal paths from the first die, the second die, or both, to the set of external contacts.

Example 36 includes the device of Example 35, wherein a back of the second die is coupled to the first side of the substrate, and wherein the back of the second die is opposite the second face.

Example 37 includes the device of Example 35 or Example 36, wherein the first die is devoid of through-silicon vias.

Example 38 includes the device of any of Examples 35 to 37, wherein the first die further comprises a first back and a first inactive region adjacent to the first back, and wherein the first back is devoid of electrical contacts.

Example 39 includes the device of any of Examples 35 to 38, wherein the second die is devoid of through-silicon vias.

Example 40 includes the device of any of Examples 35 to 39, wherein the second die further comprises a second back and a second inactive region adjacent to the second back, and wherein the second back is devoid of electrical contacts.

Example 41 includes the device of any of Examples 35 to 40, wherein the first circuitry includes one or more first transistors and a first power distribution network (PDN), and wherein the second circuitry includes one or more second transistors and a second PDN.

Example 42 includes the device of Example 41, wherein the first PDN is electrically connected to the second PDN through the first die-interconnect contacts and the second die-interconnect contacts.

Example 43 includes the device of Example 41 or Example 42, wherein the one or more first transistors are electrically connected to the one or more second transistors through the first die-interconnect contacts and the second die-interconnect contacts.

Example 44 includes the device of any of Examples 41 to 43, wherein the stacked IC device further comprises at least one first integrated capacitor device (ICD) disposed between the first face and the first side of the substrate and electrically connected to the first PDN.

Example 45 includes the device of any of Examples 41 to 44, wherein the stacked IC device further comprises at least one second ICD disposed adjacent to the first die and electrically connected to the second PDN.

Example 46 includes the device of any of Examples 41 to 45, wherein the stacked IC device further comprises an interposer device comprising a plurality of conductive vias electrically connected to the redistribution layers and to a plurality of the external contacts.

Example 47 includes the device of any of Examples 35 to 46, wherein the stacked IC device further comprises mold compound at least partially encapsulating the first die, the second die, the redistribution layers, and the interconnect conductors.

Example 48 includes the device of Example 47, wherein at least one of the interconnect conductors includes a through-mold via.

Example 49 includes the device of any of Examples 35 to 48, wherein the stacked IC device further comprises at least one additional device disposed adjacent to the first die and electrically connected to the first circuitry, the second circuitry, or both, through the redistribution layers.

Example 50 includes the device of any of Examples 35 to 49, wherein the stacked IC device further comprises at least one additional device disposed adjacent to the second die and electrically connected to the first circuitry, the second circuitry, or both, through the interconnect conductors and the redistribution layers.

Example 51 includes the device of any of Examples 35 to 50 and further includes at least one additional device coupled to the stacked IC device through second interconnect conductors, wherein the first die is disposed between the at least one additional device and the redistribution layers, and wherein additional circuitry of the at least one additional device is electrically connected to the first circuitry, the second circuitry, or both, through the second interconnect conductors and the redistribution layers.

Example 52 includes the device of any of Examples 35 to 51, wherein the first die is a first chiplet and the second die is a second chiplet designed to operate in conjunction with the first chiplet.

Example 53 includes the device of Example 52, wherein the first circuitry includes one or more first functional circuit blocks and the second circuitry includes one or more second functional circuit blocks, and wherein the one or more first functional circuit blocks and the one or more second functional circuit blocks are operationally dependent upon one another.

The various features of the disclosure described herein can be implemented in different systems without departing from the disclosure. It should be noted that the foregoing aspects of the disclosure are merely examples and are not to be construed as limiting the disclosure. The description of the aspects of the present disclosure is intended to be illustrative, and not to limit the scope of the claims. As such, the present teachings can be readily applied to other types of apparatuses and many alternatives, modifications, and variations will be apparent to those skilled in the art.

The invention claimed is:

1. A stacked integrated circuit (IC) device comprising:

a first die having a first face, a first active region adjacent to the first face, first circuitry disposed in the first active region, and first die-interconnect contacts disposed on the first face and electrically connected to the first circuitry;

a second die having a second face, a second active region adjacent to the second face, second circuitry disposed in the second active region, and second die-interconnect contacts disposed on the second face and electrically connected to the second circuitry, the first active region of the first die and the second active region of the second die positioned between a first inactive region of the first die and a second inactive region of the second die, wherein the first die-interconnect contacts are electrically connected to the second die-interconnect contacts;

a mold compound at least partially encapsulating the second die;

a set of redistribution layers electrically connected to redistribution contacts on the first face, the second face, or both, wherein the set of redistribution layers are disposed on the second face of the second die and on a surface of the mold compound that is coplanar with the second face of the second die; and interconnect conductors external to the first die and external to the second die and electrically connected to the redistribution layers to provide signal paths from the first die, the second die, or both, to a set of external contacts.

2. The stacked IC device of claim 1, further comprising a substrate, wherein a back of the second die is coupled to a first side of the substrate and the external contacts are coupled to a second side of the substrate, and wherein the back of the second die is opposite the second face.

3. The stacked IC device of claim 1, wherein the first die and the second die are devoid of through-silicon vias.

4. The stacked IC device of claim 1, wherein the first die further comprises a first back, the first inactive region adjacent to the first back, and wherein the first back is devoid of electrical contacts.

5. The stacked IC device of claim 1, wherein the second die further comprises a second back, the second inactive region adjacent to the second back, and wherein the second back is devoid of electrical contacts.

6. The stacked IC device of claim 1, wherein the first circuitry includes one or more first transistors and the second circuitry includes one or more second transistors, and wherein the one or more first transistors are electrically connected to the one or more second transistors through the first die-interconnect contacts and the second die-interconnect contacts.

7. The stacked IC device of claim 1, further comprising at least one first integrated capacitor device (ICD) disposed between the first face and the set of external contacts and electrically connected to a power distribution network (PDN) of the first die.

8. The stacked IC device of claim 1, further comprising at least one second ICD disposed adjacent to the first die and electrically connected to a PDN of the second die.

9. The stacked IC device of claim 1, further comprising an interposer device comprising a plurality of conductive vias electrically connected to the redistribution layers and to a plurality of the external contacts.

10. The stacked IC device of claim 1, wherein the mold compound at least partially encapsulates the interconnect conductors.

11. The stacked IC device of claim 10, wherein at least one of the interconnect conductors includes a through-mold via.

12. The stacked IC device of claim 1, further comprising at least one additional device disposed adjacent to the first die and electrically connected to the first circuitry, the second circuitry, or both, through the redistribution layers.

13. The stacked IC device of claim 1, further comprising at least one additional device disposed adjacent to the second die and electrically connected to the first circuitry, the second circuitry, or both, through the interconnect conductors and the redistribution layers.

14. The stacked IC device of claim 1, further comprising at least one additional device and second interconnect conductors, wherein the first die is disposed between the at least one additional device and the redistribution layers, and wherein additional circuitry of the at least one additional device is electrically connected to the first circuitry, the second circuitry, or both, through the second interconnect conductors and the redistribution layers.

15. The stacked IC device of claim 1, wherein the first die is a first chiplet and the second die is a second chiplet designed to operate in conjunction with the first chiplet.

16. The stacked IC device of claim 15, wherein the first circuitry includes one or more first functional circuit blocks and the second circuitry includes one or more second functional circuit blocks, and wherein the one or more first functional circuit blocks and the one or more second functional circuit blocks are operationally dependent upon one another.

17. A method comprising:

at least partially encapsulating a first die having a first face in a mold compound, wherein the first face of the first die corresponds to a surface of the first die bounding a first active region of the first die;

forming a set of redistribution layers, wherein the set of redistribution layers are disposed on the first face of the first die and on a surface of the mold compound that is coplanar with the first face of the first die;

forming interconnect conductors external to the first die and electrically connected to the redistribution layers; and electrically connecting the first die face-to-face with a second die using first die-interconnect contacts disposed on the first face of the first die and second die-interconnect contacts disposed on a second face of the second die, wherein the second face of the second die corresponds to a surface of the second die bounding a second active region of the second die, the first active region of the first die and the second active region of the second die positioned between a first inactive region of the first die and a second inactive region of the second die, and wherein the first active region and the second active region include circuitry, wherein the set of redistribution layers are electrically connected to redistribution contacts on the first face, the second face, or both, and wherein the interconnect conductors are external to the second die and provide signal paths from the first die, the second die, or both, to a set of external contacts.

18. The method of claim 17, further comprising coupling a back of the second die to a first side of a substrate, wherein the external contacts are coupled to a second side of the substrate, and wherein the back of the second die is opposite the second face.

19. The method of claim 17, further comprising electrically connecting an interposer device to the redistribution layers and to a plurality of the external contacts, wherein the interposer device comprises a plurality of conductive vias.

20. The method of claim 17, further comprising at least partially encapsulating the second die and the interconnect conductors in a second mold compound.

21. The method of claim 17, further comprising forming one or more through-mold vias, wherein at least one of the interconnect conductors includes a through-mold via.

22. The method of claim 17, further comprising electrically connecting at least one additional device to first circuitry of the first die, second circuitry of the second die, or both, through the redistribution layers.

23. A device comprising:

a substrate having a set of external contacts on a second side; and a stacked integrated circuit (IC) device on a first side of the substrate, the stacked IC device comprising:

a first die having a first face, a first active region adjacent to the first face, first circuitry disposed in the first active region, and first die-interconnect contacts disposed on the first face and electrically connected to the first circuitry;

a second die having a second face, a second active region adjacent to the second face, second circuitry disposed in the second active region, and second die-interconnect contacts disposed on the second face and electrically connected to the second circuitry, the first active region of the first die and the second active region of the second die positioned between a first inactive region of the first die and a second inactive region of the second die, and wherein the first die-interconnect contacts are electrically connected to the second die-interconnect contacts;

a mold compound at least partially encapsulating the second die;

a set of redistribution layers electrically connected to redistribution contacts on the first face, the second face, or both, wherein the set of redistribution layers are disposed on the second face of the second die and on a surface of the mold compound that is coplanar with the second face of the second die; and interconnect conductors external to the first die and external to the second die and electrically connected to the redistribution layers to provide signal paths from the first die, the second die, or both, to the set of external contacts.

24. The device of claim 23, wherein the stacked IC device further comprises an interposer device comprising a plurality of conductive vias electrically connected to the redistribution layers and to a plurality of the external contacts.

25. The device of claim 23, wherein the mold compound at least partially encapsulates the second die and the interconnect conductors.

26. The device of claim 23, wherein at least one of the interconnect conductors includes a through-mold via.

27. The device of claim 23, wherein the stacked IC device further comprises at least one additional device disposed adjacent to the first die and electrically connected to the first circuitry, the second circuitry, or both, through the redistribution layers.

28. The device of claim 23, wherein the stacked IC device further comprises at least one additional device disposed adjacent to the second die and electrically connected to the first circuitry, the second circuitry, or both, through the interconnect conductors and the redistribution layers.

29. The device of claim 23, further comprising at least one additional device coupled to the stacked IC device through second interconnect conductors, wherein the first die is disposed between the at least one additional device and the redistribution layers, and wherein additional circuitry of the at least one additional device is electrically connected to the first circuitry, the second circuitry, or both, through the second interconnect conductors and the redistribution layers.

30. The stacked IC device of claim 1, further comprising:

at least one first integrated capacitor device (ICD) electrically connected to a power distribution network (PDN) of the first die, wherein the first ICD and the second die are positioned on a first side of the set of redistribution layers; and at least one second ICD electrically connected to a PDN of the second die, wherein the second ICD and the first die are positioned on a second side of the set of redistribution layers opposite the first side.

* * * * *